(12) United States Patent
Kuzdrall

(10) Patent No.: US 7,707,896 B2
(45) Date of Patent: May 4, 2010

(54) MECHANICAL AMPLIFICATION OF SMALL DIMENSIONAL CHANGES USING BOWING

(76) Inventor: James A. Kuzdrall, P.O. Box 1247, Nashua, NH (US) 03061-1247

( * ) Notice: Subject to any disclaimer, the term of this patent is extended or adjusted under 35 U.S.C. 154(b) by 185 days.

(21) Appl. No.: 12/014,153

(22) Filed: Jan. 15, 2008

(65) Prior Publication Data

US 2009/0178488 A1 Jul. 16, 2009

(51) Int. Cl.
    *G01N 3/20* (2006.01)
(52) U.S. Cl. ........................................................ 73/849
(58) Field of Classification Search ................... 73/161, 73/849
    See application file for complete search history.

(56) References Cited

U.S. PATENT DOCUMENTS

| 3,170,320 | A | * | 2/1965 | Talmo ........................... 73/654 |
| 4,318,023 | A | * | 3/1982 | O'Neill et al. ................. 310/328 |
| 4,933,591 | A | * | 6/1990 | Stahlhuth ....................... 310/328 |
| 5,022,377 | A | * | 6/1991 | Stevens ......................... 124/23.1 |
| 7,093,498 | B2 | * | 8/2006 | Herbert et al. ................. 73/778 |
| 7,228,746 | B2 | * | 6/2007 | Maubant et al. ............... 73/849 |
| 7,436,104 | B2 | * | 10/2008 | Clingman et al. ............ 310/339 |
| 7,549,345 | B2 | * | 6/2009 | Prevey ........................... 73/856 |
| 2008/0216585 | A1 | * | 9/2008 | Cipra ........................... 73/851 |

* cited by examiner

*Primary Examiner*—Lisa M Caputo
*Assistant Examiner*—Octavia Davis
(74) *Attorney, Agent, or Firm*—Michael J. Weins; Jeffrey E. Semprebon

(57) ABSTRACT

The method and apparatus employ a resilient element having end definition points that are constrained between stops spaced apart at a separation S. The separation S is less than a free length L between the end definition points when not constrained, causing the resilient element to bow and resulting in a displacement m of a central region of the resilient element. The displacement m changes responsive to the net change in the separation S and the free length L. When the geometry is set such that the displacement m is very small, a relatively large change in displacement m results from small net changes. The change in the displacement m can be monitored to provide a micro strain gauge. The stops can be mounted to a substrate which differs from the resilient element in its response to a selected environmental stimulus to provide a sensor for the environmental stimulus.

20 Claims, 11 Drawing Sheets

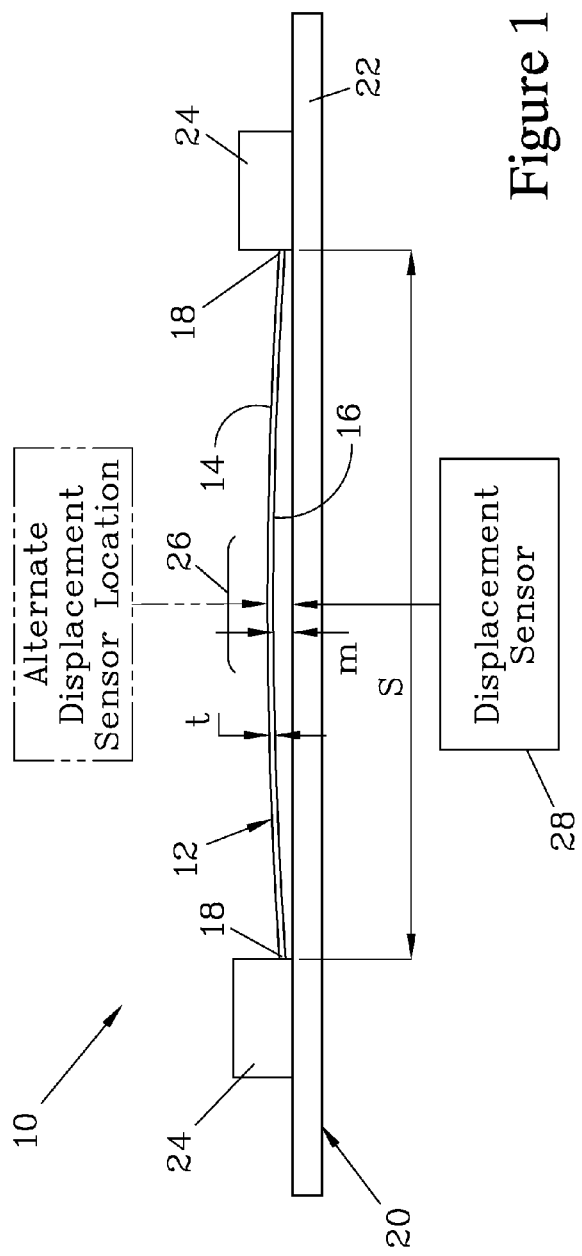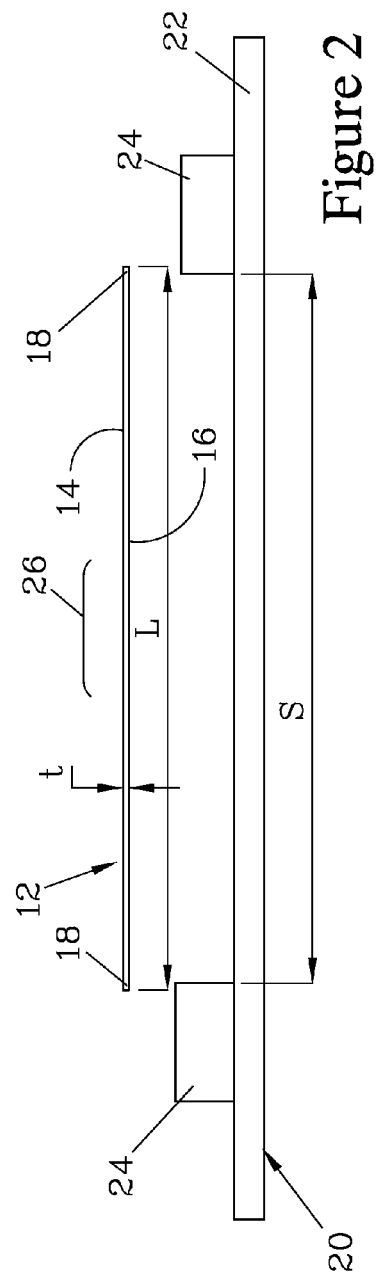

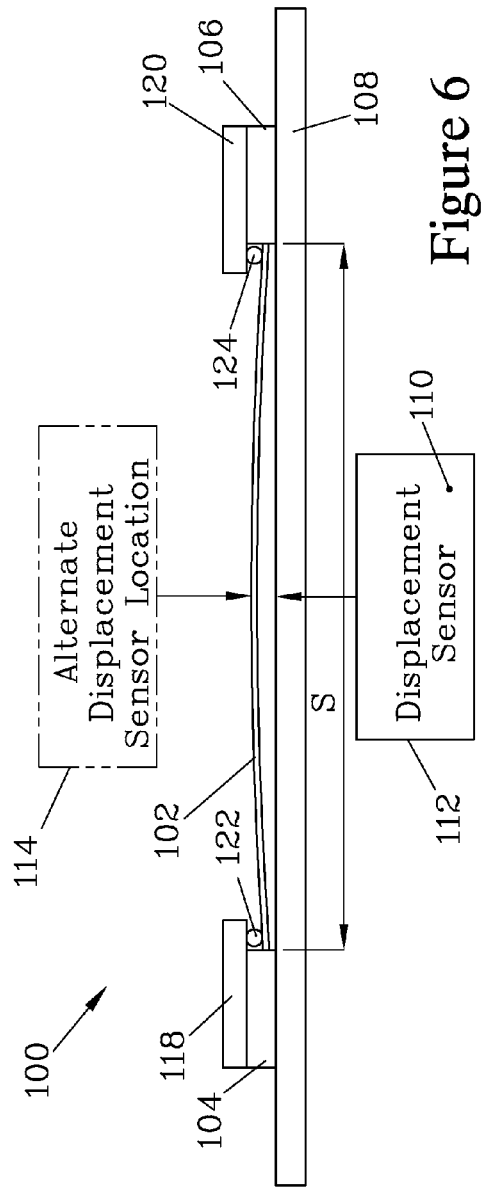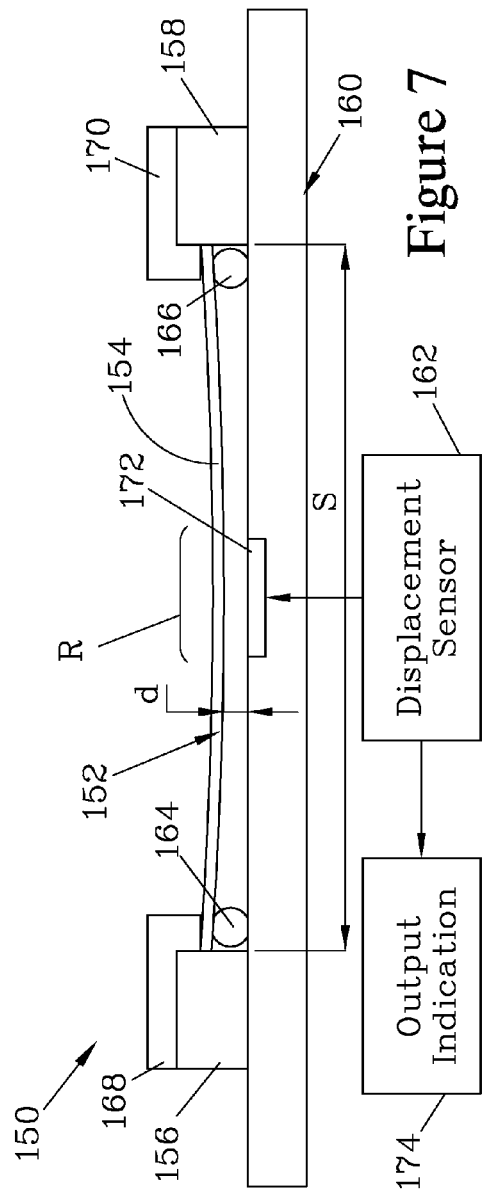

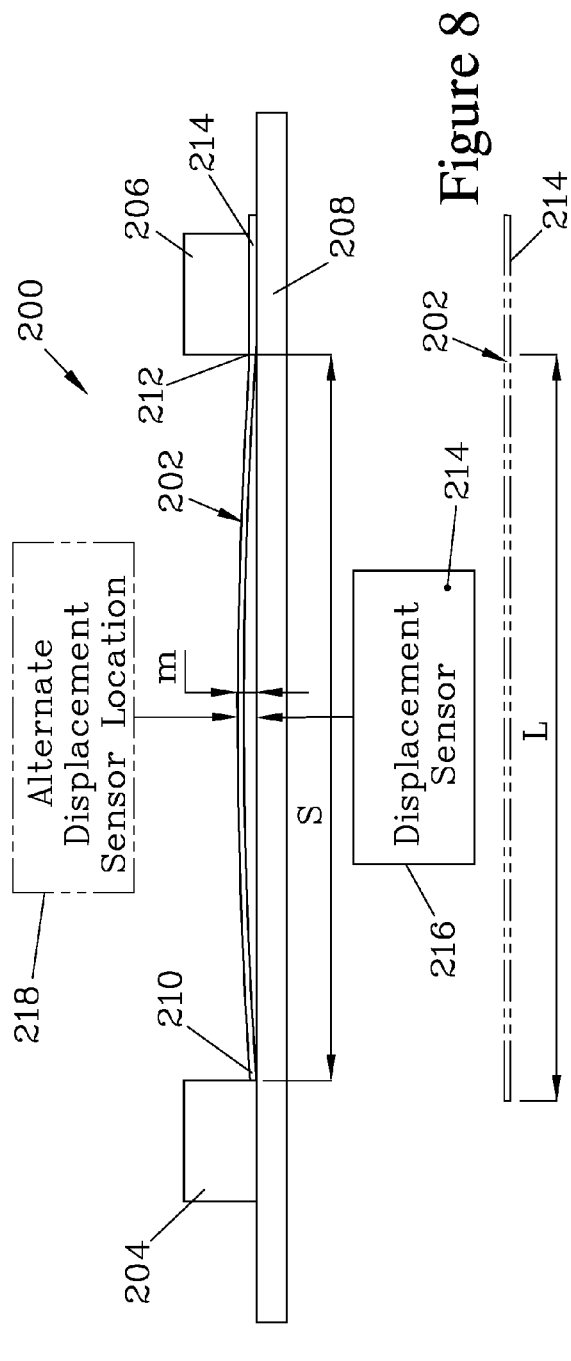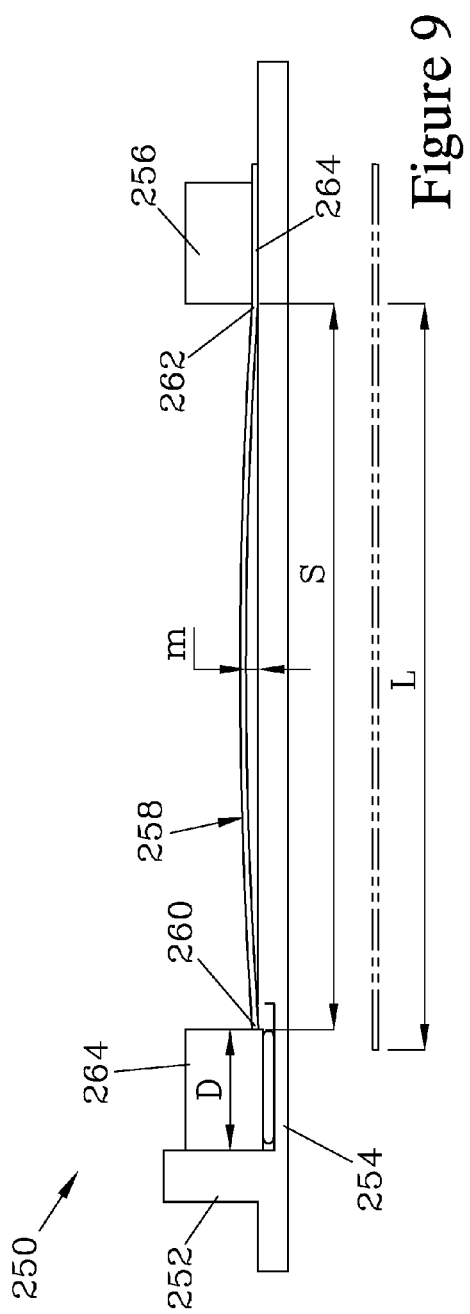

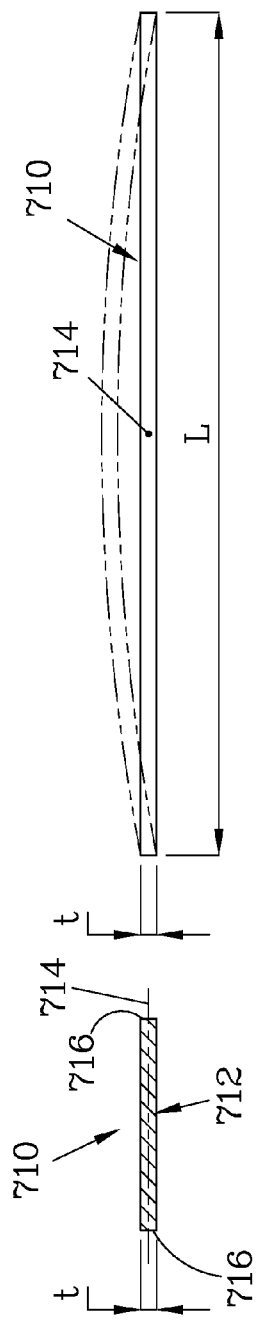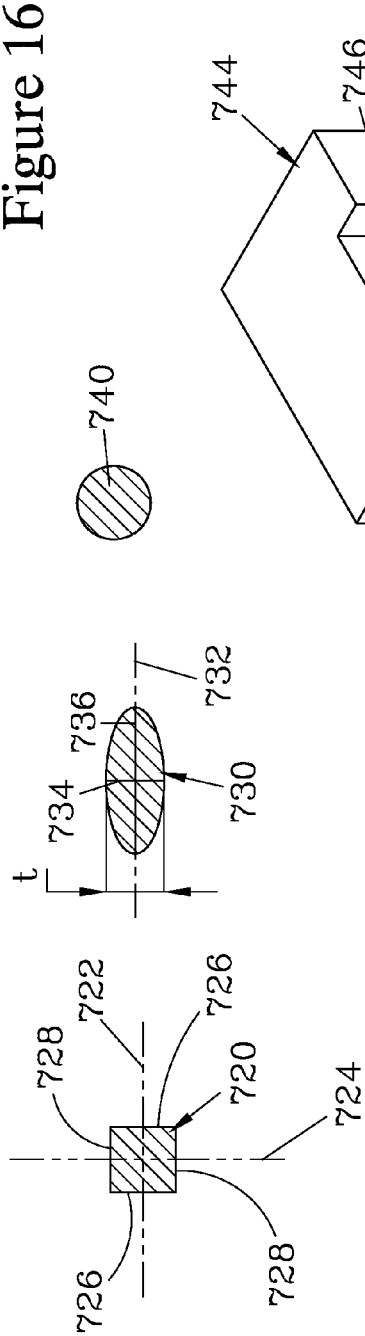
Figure 16
Figure 17

MECHANICAL AMPLIFICATION OF SMALL DIMENSIONAL CHANGES USING BOWING

FIELD OF THE INVENTION

The present invention relates a mechanical amplifier which is capable of monitoring a dimensional change and amplifying the same. When operating under the appropriate conditions, the amplifier can serve as a sensor for monitoring changes in environmental parameters. This function can be provided by monitoring the effect of the environmental parameter on an element of the mechanical amplifier that is responsive to the environmental parameter, changing its length as the environmental parameter changes. Since the amplification of this change in length is large, one can monitor very small changes in size of the element and thereby very small changes in the environmental parameter.

BACKGROUND OF THE INVENTION

The monitoring of length changes of an element in response to exposure to an environmental parameter has been classically used to monitor changes in the environment. A fiber's length has been long used to monitor changes in weather conditions, such as in the classic weather predictor having a witch and children in a house, where the change in the length of the fiber causes the witch and children to rotate into and out of the house through a mechanical linkage.

Similarly, thermal expansion has been commonly used to monitor temperature change. One example of such a device is the use of a bimetallic strip to measure temperature changes by monitoring the change in curvature of the strip caused by the differential expansion of the elements of the strip.

While the above techniques offer a convenient way to measure environmental changes, the sensitivity of these techniques is limited by the sensitivity of the instruments that are currently available to measure the incremental changes resulting from the environmental changes. Direct observation or the use of mechanical linkages are reasonably easy to implement, but are relatively insensitive techniques for measuring and/or amplifying length changes. The changes in length from expansion can be measured more accurately by piezoelectric sensors, optical interferometry, semiconductor strain gauges, and many other techniques which increase the sensitivity of the response to the change in the environmental parameter.

However, even the most sensitive of these techniques for measuring expansion cannot measure very small changes, that is, expansions on the order of one part in a trillion. For example, a temperature increase of only 5 millionths of a degree Centigrade in a 1 millimeter length of aluminum creates a thermal expansion of one part in a trillion.

SUMMARY OF THE INVENTION

The present invention is for a method for mechanically monitoring and amplifying the change in length of one or more coupled elements and a device for doing the same. One application for this method and device is for measuring the change in length with great precision even for very small elements and to do so indirectly; among other applications, this allows monitoring micro strains and, from such measurements, providing a high resolution map of the strain field over a surface.

The method of present invention is conducted by monitoring a net change in a free length L of a resilient element, which is the distance along the resilient element bounded between opposing end definition points of the resilient element, and a separation S of these end definition points. These end definition points are restrained by pair of non-compliant stops so as to be maintained at the separation S which is less than the free length L, thereby providing a bowing of the resilient element resulting in a displacement m of a central region of the resilient element with respect to a line joining the end definition points. The change in the bowing can be the result of a change in the length of the free length L of the resilient element or a change in the separation S, or a combination of the two. In all cases, the changes in free length L, the separation S, or a combination thereof is monitored by monitoring the change in the bowing. The geometry of the bowing can be selected such that very small changes in the lengths can result in a much larger displacement m, thereby providing amplification of the net length change.

In case where the free length L of the resilient element is maintained constant and the displacement is caused by the change in separation S between the non-compliant stops, the resulting device provides a strain gauge when the non-compliant stops are attached to a surface where strains are to be monitored.

For the case where the free length L changes and the separation S of the non-compliant stops is fixed, monitoring can be done by measuring bowing, which in this case results from small incremental changes in the free length L of the resilient element when slightly bowed, by observing the incremental displacement of the central region of the free length L of the resilient element, rather than by directly measuring the change in the free length L of the resilient element. This has particular utility when the length change is caused by an environmental change.

For many applications where the device is employed to track environmental changes, it is preferred that the non-compliant stops be attached to a rigid substrate to form a frame which holds the resilient element. When a frame is employed, the substrate rather than the resilient element can be sensitive to the environmental stimulus. It should be appreciated that both the resilient element and the frame can be responsive to the environmental stimulus, in which case the change will be responsive to the net difference in the lengths of the components.

To practice the method for monitoring environmental changes, one must select a material for one of the elements that is responsive to an external stimulation (such as temperature change, magnetic flux, etc.) to be monitored. The material which is responsive can be used to form either the resilient element itself or the frame employed to restrain the resilient element. If the latter is the case, and the length of the resilient element remains constant, then the difference in curvature of the resilient element results from the change in separation of the elements of the frame that constrain the free length L. It is possible for both the resilient element and the frame to be responsive to the external stimulation, in which case the change in curvature will be proportional to the differential response of the resilient element and the frame.

It is frequently preferred for the resilient element to be responsive, since it will be relatively thin so as to readily bend while still assuring that the bending will not result in permanent deformation, and thus will remain resilient under the loads applied. Having the resilient element thin will also significantly lessen its mass and thus increase the responsiveness of the bowing element to small changes in the external stimulation.

In all cases, the bowing provides a mechanical gain greater than one in the differential bowing with incremental changes in length of the resilient element or, for a constant length element, for small changes in the separation of the end definition points of the resilient element when the bowing is less than the radius of the arc. In general, the gain will increase as the curvature of bowing decreases. The bowing gain can be determined as a function of the geometry of the element, either graphically or, in closed form, by mathematical algorithm.

To practice the method of the present invention, a mechanical amplifying device is employed which has non-compliant stops that are rigidly fixed and which serve to constrain a free length L of a resilient element between a first end definition point and a second end definition point of the resilient element. The stops can be affixed to a substrate to form a frame or can be formed as integral parts thereof; alternatively, when strain of a structure is to be monitored, the stops can be affixed directly to the structure to be monitored.

The non-compliant stops can take a variety of forms for various applications. A simple form of the non-compliant stops are a pair of protrusions having vertical faces at a separation S therebetween. When such stops are employed, the end definition points of the free length L of the resilient element are the terminal surfaces of the resilient element and the terminal surfaces of the resilient element forcibly abut the stops when in service. To prevent the resilient element from falling out in the event that its free length L becomes less than the stop separation S, the stops can be provided with caps that reside above the stops to entrap the ends. Alternatively, one or both of the non-compliant stops can be formed by a clamp that grips the resilient element, in which case the resilient element has at least one extension which extends beyond the end definition point defining the free length L. When clamping is done, the free length L must be sufficiently large that clamping does not significantly effect the bowing response for the range of bowing encountered.

The functionality of the device when it serves to monitor environmental changes results from a differential response of the substrate and the resilient element to the external stimulus. Thus, at a minimum, the substrate and the resilient element must have differential responses to the external stimulus. To simplify the analysis of the response, it is preferred for the response of one of the elements of the device to be negligible when compared to the other so that it can be neglected in the analysis. It is preferred that the principal response to the external stimulus be by the resilient element rather than by the substrate, since the resilient element will be the thinner of the elements and thus should be more responsive to small changes in the external stimulation.

As pointed out above, the gain of the device is related to the curvature of the resilient element. If a specific gain is required, it is preferred that the device be provided with means for adjusting the geometry so that the desired gain condition is satisfied. This adjustment can be done by providing an adjustable spacer positioned between one of the stops and the resilient element, one example of such an element being a piezoelectric spacer. The geometry to obtain the desired gain can also be achieved by a negative feedback system which artificially stimulates the resilient element and the frame so as to counteract changes caused by the environmental stimulus and set the incremental change in the standard bend, effectively holding the gain constant and linearizing the response. In such cases, the monitoring is accomplished by monitoring the degree of artificial stimulation needed to counteract the environmental changes. There are a variety of techniques that can be employed for measuring the change, one of which is a Blumlein bridge.

Means for monitoring the displacement m of the central region of the resilient element are provided, and preferably means for converting the change in this displacement to change in the external stimulus are also provided. Any of a variety of means for monitoring which do not require mechanical contact can be used, such as using the capacitance between the frame and the bowed plate, using an interferometer, etc.

BRIEF DESCRIPTION OF THE FIGURES

FIG. 1 is an illustration of a mechanical amplifier that forms one embodiment of the present invention, which employs a resilient element responsive to an external stimulus, and a frame having a rigid substrate and non-compliant stops that are non-responsive to the external stimulus, forming a non-responsive frame for mounting the resilient element therein. The combination serves to provide an amplifier.

FIG. 2 is a partially disassembled view of the resilient element and frame shown in FIG. 1, illustrating the resilient element in an unconstrained state where it is substantially planar, having a free length L that is greater than a separation S between the non-compliant stops.

FIG. 6 illustrates a mechanical amplifier embodiment similar to the embodiment shown in FIGS. 1-3. It differs in that the stops of the frame are fitted with a pair of restraining caps for holding the resilient element in place with respect to the frame while still allowing pivotal motion of end definition points of the resilient element.

FIG. 7 illustrates a mechanical amplifier embodiment where the mounting of the resilient element in the frame is similar to that shown in FIG. 6, but where increased bowing of the resilient element moves a central region of the resilient element closer to a substrate of the frame, rather than further away.

FIG. 8 shows an alternate embodiment of a mechanical amplifier having a resilient element, where the resilient element has an extension which extends the resilient element beyond one of the end definition points of the free length L. This extension is clamped by one stop while the other end definition point forms a free end of the resilient element and abuts a blocking surface of another stop. In this embodiment, the separation S between the clamp and the opposing stop is chosen sufficiently large that, for small bowing that will occur, the effect of the clamping will not significantly effect the bowing and the resulting gain.

FIG. 9 shows another mechanical amplifier embodiment, which has many features in common with that shown in FIG. 8, but where the frame employs a pair of stops, one of which clamps an extension of the resilient element in place and the other stop being spaced away from the resilient element. A block of a piezoelectric material is interposed between the second of the stops and the resilient element, and abuts the resilient element. The bowing of the resilient element can be controlled by providing a voltage across the piezoelectric block to change in the length of the block.

FIG. 16 illustrates examples of cross-sections that can be employed for the resilient element of the mechanical amplifier of the present invention.

FIG. 17 illustrates a stop that can be employed to guidably restrain one end of a resilient element having a circular cross section. The stop has a vertical slot sized to guidably engage the end of the resilient element to assure that bowing is constrained to a vertical plane containing the vertical slot.

DETAILED DESCRIPTION OF THE PREFERRED EMBODIMENTS

Figure 3:
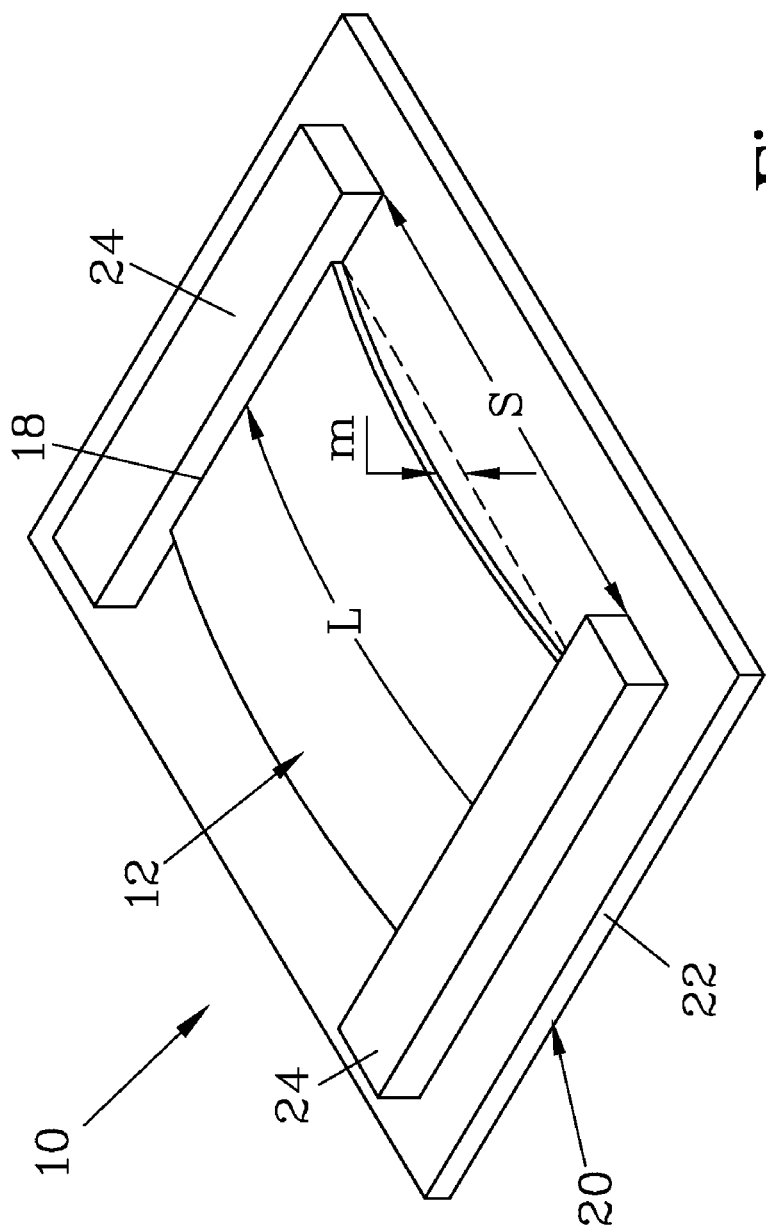
FIG. 3 is an isometric view of the amplifier shown in FIGS. 1 and 2 when the resilient element is constrained by the frame, as shown in FIG. 1.

FIG. 1 is a side view of a mechanical amplifier 10 of the present invention which illustrates the structural elements of one embodiment of the present invention which, as illustrated, is suitable for monitoring a change in an environmental stimulus. In FIG. 1, the mechanical amplifier 10 is assembled, while the same elements are shown before assembly in FIG. 2. FIG. 3 is an isometric view of the mechanical amplifier 10 when assembled.

The mechanical amplifier 10 has a resilient element 12 having an upper surface 14 and a lower surface 16 separated by a thickness t. When unconstrained, the resilient element 12 is essentially flat, as is illustrated in FIG. 2, and has an unconstrained free length L defined by the distance between opposing end definition points 18 which, for this embodiment, are formed by opposing ends of the resilient element 12. The ratio of t/L is chosen to assure that all deformation to be experienced in service is elastic.

A frame 20 is provided in this embodiment for restrainably engaging the resilient element 12. The frame 20 has a substrate 22 having non-compliant stops 24 attached thereto; the stops 24 could be formed as integral parts of the substrate 22. The non-compliant stops 24 are spaced apart, having a separation S therebetween which is less than L (as shown in FIG. 2), introducing a bow into the resilient element 12 when engaged in the frame 20. The specified separation can be provided by affixing the stops 24 to the substrate 22 and then micro-machining the non-compliant stops 24 to create the desired spacing. This bowing results in a displacement m of a central portion 26 of the resilient element 12 with respect to a line drawn between the opposing end definition points 18 (which, in this embodiment, is along the surface of the substrate 22) when the resilient element 12 is constrained by the frame 20.

A displacement sensor 28 is provided, which monitors the displacement m as a function of time in the event that either the length L of the resilient element 12 or the separation S between the stops 24 changes, or both. The displacement sensor 28 can be selected from a variety of readily available devices such as a Blumlein capacitive bridge, a capacitive oscillator, a laser interferometer, a beam deflection mirror, or any other non-contacting displacement sensor. This displacement sensor 28 serves as means for monitoring the change in incipient bowing of the resilient element 12 as a function of the change in the free length L of the resilient element 12, the change in the separation S of the stops 24, or composite change (net change of both elements).

While the above device will generally work to allow one to monitor either the net change of S and L, such is particularly beneficial when the curvature of the element is relatively small, for the reasons set forth below. The determination of the value for this curvature and the benefit resulting from maintaining a small curvature (i.e., nearly flat) is discussed in greater detail below in the discussion of FIGS. 4 and 5.

The mechanical amplifier 10 operates by bowing the resilient element 12 in response to a differential change in the free length L of the resilient element 12 and the separation S of the stops 24. The amplifier 10 provides a gain greater than unity for any bowing that results in the bowed resilient element 12 being so bowed to form a curve which is less than a semicircle. For example, when the ratio of the free length L to the displacement m is greater than 27, gains of greater than 10 are obtained, calculated using Equation 6 below.

Figure 4:
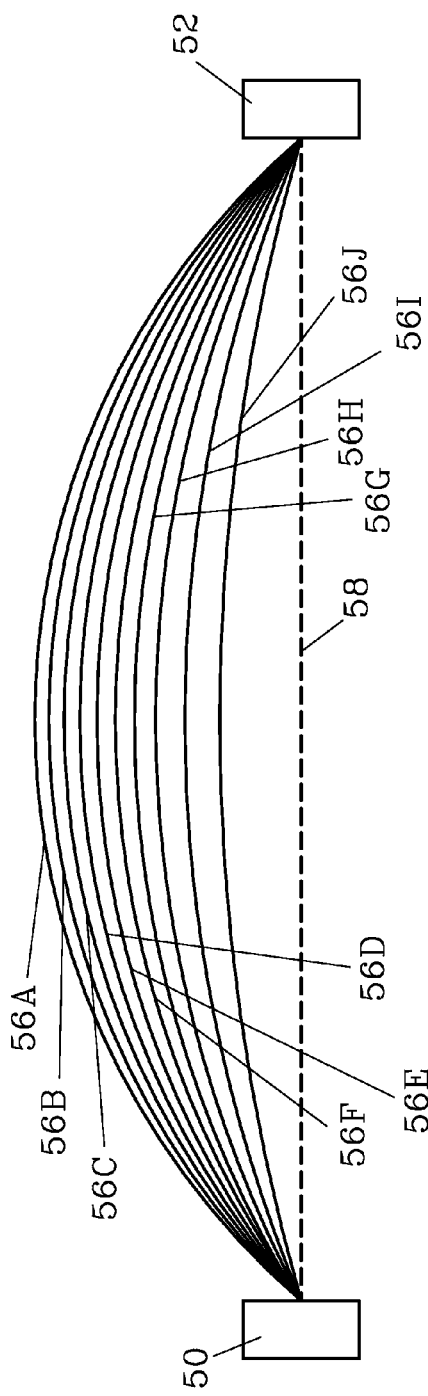
FIG. 4 is a graphical demonstration of the curvature that will result in a gain experienced by a resilient element as a function of the change in length of the element when pinned between two fixed stops mounted on a support.

FIG. 4 illustrates a graphical demonstration for a set of conditions where there will be a gain in m as compared to a change in L between two fixed stops (50, 52) mounted on a stationary surface such as a desk top. Stops (50, 52) constrain resilient paper strips 56A to 56J, paper strips that will spring back to their flat shape when unconstrained. Stops (50, 52) are separated by 100 mm in this demonstration. Strip 56A is 110 mm long; strip 56B is 109 mm long; strip 56C is 108 mm long, and so on, until reaching strip 56J which is 101 mm long. It is visually apparent that the vertical separation at the center of the strips increases as the strips get closer to a base line 58 representing the distance separating the stops (50, 52). The gap between strips 56A and 56B is clearly smaller than that between 56I and 56J. This increase in displacement between adjacent strips 56 as their length approaches the distance separating the stops (50, 52) occurs despite them being the same incremental decrease in length (1 mm different in each case).

A graphical measurement of FIG. 4 shows that the 1 mm length change between strips 56A (110 mm) and 56B (109 mm) causes a gap between them of 1.2 mm, a gain of 1.2 mm/1.0 mm or 1.2. By comparison, the 1.0 mm length change between strips 56I (102 mm) and 56J (101 mm) causes a gap change of 3.0 mm for a gain of 3. The gain clearly increases as the lengths of the strips approach the unstressed length. It may be noted that the effect does not depend on a particular material, and depends only on the length of the strip being constrained.

While the example of FIG. 4 is helpful in developing an intuitive appreciation of the effect of curvature on the effective gain, an analytical relationship can be developed to show the magnitudes of gains for very small displacements, magnitudes smaller than can be demonstrated on a desk top. The analytical relationship also allows a user to define an appropriate geometry and thus construct a device of appropriate size to achieve a desired gain.

Figure 5:
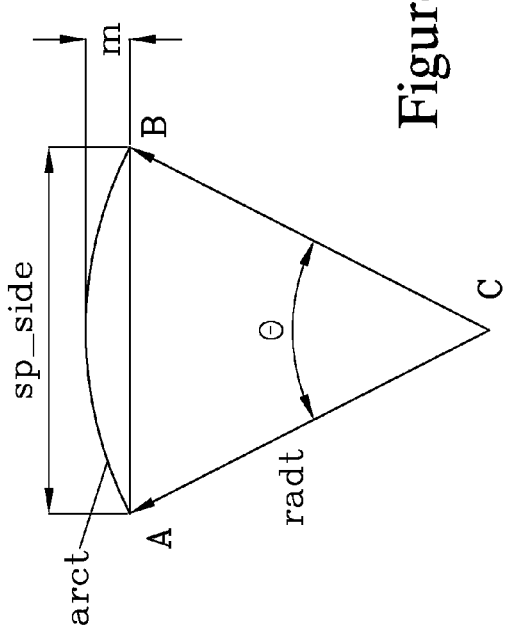
FIG. 5 is a graphic illustration of a bowed element constrained between two fixed points and the geometric parameters that can be used to define the bowed element. Equations relating the geometric parameters can be combined to result in a closed form analytical solution to define the curvature needed to determine the limits of effectiveness of the bowing constraint when appropriate approximations are made. This analysis can be employed to generate a chart showing the gain resulting from the change in displacement m as the length of the resilient element changes. The gain is presented as a function of the separation of the ends of the resilient element and the maximum displacement m from the horizontal.

FIG. 5 illustrates the geometry associated with a curved surface which would result from pinning between two stops (A, B). The straight line between A and B represents the unstressed free length L of resilient element 12 of FIG. 1. It has a length of sp_side. The arc between A and B, arct, represents the bowed condition of the resilient element 12. The center of the arct circle is at C. The lines from C to A and from C to B are radii of that circle. The central displacement between the bowed and unbowed resilient element 12 is m.

Equation 1 formulates the arc length arct in terms of the radius and subtended angle.

$$arct = radt * \Theta \quad \text{(Equation 1)}$$

Equation 2 invokes the Pythagorean Theorem, relating radt to the knowns, $$radt^2 = (sp\_side/2)^2 + (radt - m)^2 \quad \text{(Equation 2)}$$

Equation 3 is a formula for $\Theta$ that has no unknowns in the trigonometric arguments:

$$\Theta = 4 * a\tan(2*m / sp\_side) \quad \text{(Equation 3)}$$

To get Equation 3, start with the identity $\tan(\Theta/2) = (1 - \cos(\Theta))/\sin(\Theta)$. Substitute the segment ratios for the cosine and sine. Serendipitously, the radt terms cancel, giving $\tan(\Theta/2) = 2*m / sp\_side$. (The formula merely identifies similar triangles in the drawing.) Finally, Equation 4 relates the expanded length to the unexpanded length, where dsp represents the length change in sp_side when it bows to arct:

$$arct = sp\_side + dsp \quad \text{(Equation 4)}$$

Equation 5 uses Equation 1 through Equation 4 to eliminate unknown variables radt, $\Theta$, and arct, leaving dsp (the length change of sp_side) as a function of knowns.

$$dsp = \frac{(4*m^2 + sp\_side^2) * a\tan(2*m/sp\_side) - 2*sp\_side*m}{2*m} \quad \text{(Equation 5)}$$

To get the gain, perform a mathematical differentiation on Equation 5 with respect to m. The reciprocal of the result is the gain, the incremental change in m for an incremental change in arct length.

$$\frac{\delta m}{\delta dsp} = \frac{2*m^2}{(4*m^2 - sp\_side^2)*a\tan(2*m/sp\_side) + 2*sp\_side*m} \quad \text{(Equation 6)}$$

When the bowing displacement m is much smaller than the resilient element length, sp_side, approximating the arc tangent, atan, with the first two terms of its Taylor Series expansion gives the simplified result of Equation 7:

$$\text{gain} = \frac{3*sp\_side}{16*m} \quad \text{(Equation 7)}$$

Table 1 below evaluates Equation 6 for the values of sp_side and m shown (in meters). The first 4 entries in Table 1 show the mechanical gain for a 10 mm element (sp_side) for a range of small bowing displacements, m. The gains span 1.904 to 7500 for the chosen conditions. The gain column indicates that the gain is inversely proportional to m. That is, as the bowing gets smaller, the gain gets proportionately larger.

TABLE 1

| sp-side | m | gain |
|---------|---|------|
| 1.00E−02 | 1.00E−03 | 1.904 |
| 1.00E−02 | 1.00E−04 | 18.753 |
| 1.00E−02 | 1.00E−05 | 187.500 |
| 1.00E−02 | 1.00E−06 | 1875.000 |
| 4.00E−02 | 1.00E−06 | 7500.000 |

The last line in the table shows that, for the same bowing displacement m, the gain increases in proportion to the length of resilient element 12, sp_side.

In particular, the last line of Table 1 indicates that, for the geometry selected, a bowing displacement m of 10,000 picometers results from a very small expansion increase of 0.67 picometers.

The only requirement for resilient element 12 is that it be resilient. Note also that sp_side is a significant parameter in the formula, meaning that the gain can be engineered to differing needs by adjusting the free length L of the resilient element 12.

The mechanical amplifier 10 shown in FIGS. 1-3 is suitable for a laboratory environment where gravity holds the resilient element 12 down. In applications where the mechanical amplifier 10 might tip or invert in service, the resilient element 12 could fall out when unstressed. FIGS. 6 through 8 show three of many possible restraints which allow the mechanical amplifier assembly to operate independent of its orientation.

FIG. 6 illustrates a mechanical amplifier 100 that has a resilient element 102 where the full length of the resilient element 102 serves as the free length L (not shown). In this embodiment, as in the embodiment shown in FIGS. 1-3, the end definition points are the free ends of the resilient element 102 and are constrained by abutting non-compliant stops (104, 106) which are attached to a substrate 108. A separation S between the non-compliant stops (104, 106) is less than the free length L of the resilient element 102, thereby creating a bow in the resilient element 102. A displacement sensor 110 serves to monitor the bowing of resilient element 102; the displacement sensor 110 can be positioned at alternate positions (112, 114), the choice of which will depend upon the type of sensor being employed.

The mechanical amplifier 100 has the stops (104, 106) attached to the substrate 108, and the resilient element 102 is positioned between the non-compliant stops (104, 106) in the same manner as the mechanical amplifier 10 shown in FIGS. 1-3. However, the mechanical amplifier 100 has additional structure to maintain the resilient element 102 in place. Retainers (118, 120) attach to the non-compliant stops (104, 106) and are positioned so that they overlap, in part, the resilient element 102. Compliant pads (122, 124) are positioned between the retainers (118, 120) and the resilient element 102 and are preferably adhered to the retainers (118, 120) for easier handling during assembly. The retainers (118, 120) are preferably made of a rigid material and attached to the non-compliant stops (104, 106); the retainers (118, 120) may be attached to their associated stops (104, 106) by mechanical fasteners or by chemical adhesive.

To assure that the resilient element 102 is securely held when uncompressed, the compliant pads (122, 124) are sized such they are slightly larger than the space between the retainer (122, 124) and the resilient element 102, and thus are slightly compressed when the resilient element 102 is placed into position.

The mechanical amplifier 100 operates in substantially the same manner as described above with respect to the mechanical amplifier 10. The slight compliant pressure from the compliant pads (122, 124) holds resilient element 102 in place without significantly affecting its bowing.

FIG. 7 is a schematic view of another mechanical amplifier 150, which is similar to the mechanical amplifier 100 that is illustrated in FIG. 6 except that it has a resilient element 152 that is supported so as to permit inward bowing. The bowing can be biased to an inward bow by electrostatic, pneumatic, or similar force or by introducing an anisotropy in the resilient element 152 by layered construction or surface treatments such as etching; in this case, an upper surface 154 of the resilient element 152 is so treated.

The most significant difference between outward and inward bowing is the relationship of bowing gap to expansion measurement gain. Inward bowing has a region of constant mechanical gain whereas the gain for outward bowing decreases inversely as the bowing gap increases.

The condition which leads to constant gain depends on the nature of the displacement instrumentation. For direct displacement measurement, such as that from a laser interferometer, the mechanical gain is the same for inward and outward bowing. However, if the instrumentation method senses the capacitance between the bowing element and an embedded electrode or some other fixed-distance reference, (the capacitance being inversely proportional to the separation), the total detection gain becomes linear with bowing displacement. The output of a Blumlein bridge or the period of a resistance-capacitance oscillator is proportional to capacitance, while the frequency of an inductance-capacitance oscillator is not; in this case, the frequency is the inverse proportionality (which does not occur with displacement measurements) which linearizes the response. Constant gain is preferred for measuring instruments or for sensing instruments which must not introduce harmonic distortion.

While inward bowing is appropriate for some measurement applications, it "saturates" (stops responding) for displacements that would be larger than the bowing gap. That is, when the bow is so great that the resilient element contacts the substrate.

In FIG. 7, the mechanical amplifier 150 again is configured such that the free length L is the full length of the resilient element 152. The resilient element 152 is positioned between non-compliant stops (156, 158) and above a substrate 160. A displacement sensor 162 is provided to measure the distance d between the resilient element 152 and the substrate 160 for a limited central region R of the resilient element 152; the distance d changes in direct proportion to changes in the displacement m (not shown) of the central region R of the resilient element 152. After the non-compliant stops (156, 158) are attached to the substrate 160 and micro-machined to provide the desired separation S, compliant pads (164, 166) are positioned as shown in FIG. 7. The resilient element 152, which is also micro-machined, is inserted between the non-compliant stops (156, 158). Preferably, the upper surface 154 has been etched, plated, or mechanically processed so as to promote inward bowing so as to bring the limited central region R closer to the substrate 160. Retainers (168, 170) are attached to the non-compliant stops (156, 158). The retainers (168, 170) are made of a rigid material. A mechanical fastener or chemical adhesive can be employed to hold the retainers (168, 170) to the non-compliant stops (156, 158), respectively.

When unassembled, the compliant pad 164 is slightly larger than the space between the retainer 168 and the substrate 160, less the thickness of the resilient element 152. When the retainer 168 is attached to the stop 156, the compliant pad 164 is slightly compressed. A similar geometry is provided for the compliant pad 166 and the retainer 170.

In this embodiment, an electrode 172 is embedded in the substrate 160. The electrode 172 forms a capacitor with the resilient element 152. The amount of capacitance is inversely proportional to the size of the distance d. To attain constant bowing gain, the displacement sensor 162 is preferably a Blumlein bridge, which responds directly to the capacitance changes caused by variations in the distance d.

An output indication 174 responds directly to the displacement sensor 162. When the bowing displacement is at a calculable optimally linear point, the output indication 174 responds directly to expansion in the resilient element 152 with minimal harmonic distortion.

The character of the inward bowing is identical to outward bowing for the mechanical amplifier 100 illustrated in FIG. 6, since the geometric conditions for the resilient elements (100, 150) are equivalent.

FIG. 8 illustrates a mechanical amplifier 200 having a resilient element 202, a first non-compliant stop 204, a second non-compliant stop 206, and a substrate 208. This embodiment differs from the earlier described embodiments in the character of the resilient element 202. In this embodiment, the resilient element 202 has again a free length L, which is bounded by a first end definition point 210 which is also a terminal end of the resilient element 202. The free length L is also bounded by a second end definition point 212. Extending the resilient element 202 is a resilient element extension 214 which continues the resilient element 202 beyond the second end definition point 210. The first end definition point 210 forcibly abuts the first stop 204 when the mechanical amplifier 200 is in service. The second end definition point 212 is maintained so as to provide a bowing in the free length L of the resilient element 202. The bowing in service is maintained by the second stop 206, which clamps the resilient extension 214 to the substrate 208, and the first stop 204. The stops (204, 206) define the free length L (shown in phantom when the resilient element 202 is in an unconstrained condition) which is bowed and resides between the first stop 204 and the second stop 206.

A displacement sensor 214 is provided and can be positioned at alternate positions 216 or 218. In many respects, the mechanical amplifier 200 is similar to the mechanical amplifier 10 illustrated in FIGS. 1-3. However, as discussed above, rather than attaching the second stop 206 directly to the substrate 208, the resilient element 202 is sandwiched or pinched between the second stop 206 and the substrate 208. The sandwich structure of the second stop 206, the extension 214, and the substrate 208 being pinched with mechanical fasteners, such a screws passing through the second stop 206 and into the substrate 208 beyond but near the second end definition point 212, creates an effective separation distance S between the first stop 204 and the second stop 206, this separation S determining the bow in the free length L of the resilient element 202 and the resulting displacement m. While the second end definition point 212 is a quasi "hinge point", for large S/m ratios it will function as a hinge and will not significantly affect the bowing of the resilient element 202. As an alternative to employing screws, the assembly of the second stop 206, the resilient element extension 214, and the substrate 208 could be rigidly bonded with a chemical adhesive such as epoxy or cyanoacrylate.

If adjustment of the bowing is to be made by changing the separation S, such can be done when the second stop 206 has been securely fastened, using micro-manipulators to position the first stop 204 so as to obtain the desired separation S. After correct positioning, the first stop 204 is fastened to the substrate 208.

The mechanical amplifier 200 shown in FIG. 8 operates similarly to the mechanical amplifier 10 illustrated in FIGS. 1-3. However, in this case, the resilient element 202 will remain in position even if its free length L is less than the separation S between the non-compliant stops 204, 206. The retaining function of the stop 206 does not significantly affect bowing of the resilient element 202.

The above embodiments, and in particular the embodiment shown in FIG. 8, may present difficulty in fabrication due to the need to precisely position the stops with respect to the length of the resilient element employed as a sensing element in order to obtain the desired geometry of the elements.

FIG. 9 is a schematic view showing a mechanical amplifier 250 which employs a first non-compliant stop 252 which is attached to a substrate 254 and a second non-compliant stop 256 that is spaced apart from the first non-compliant stop 252. A resilient element 258 is designed in a similar manner to the resilient element 202, and has a first end definition point 260 and a second end definition point 262 forming a free length L shown in phantom, and the free length L of the resilient element 258 being positioned between the non-compliant stops (252, 256). The structure of the mechanical amplifier 250 simplifies the adjustment of the bowing so as to provide a prescribed displacement m between the substrate 254 and the resilient element 258 without the need for great precision of the machining to provide a desired separation distance S between the stops (252, 256), which becomes particularly troublesome for some of the embodiments discussed earlier and, in particular, for the embodiment illustrated in FIG. 8. Again, in the embodiment of FIG. 9, the resilient element 258 has a resilient element extension 264 which is clamped between the second non-compliant stop 256 and the substrate 254. The free length L resides between the first and second non-compliant stops (252, 256) and is less than the separation S between the non-compliant stops (252, 256). An adjustable length spacer 264 is interposed between the resilient element 258 and the first non-compliant stop 252 and is adjusted to a length D so as to create an effective separation S between the stops (252, 256) selected to provide the appropriate bowing displacement m for the proper functioning of the mechanical amplifier 250. In this embodiment, the spacer 264 is a piezoelectric block that can be adjusted to alter the length D such that the effective separation S established between the end of the piezoelectric block 264 and the second stop 256 will provide the correct degree of bowing to provide the appropriate bowing displacement m between the resilient element 258 and the substrate 254. In this embodiment, the length D is adjusted by providing a controlled voltage across the piezoelectric block 264.

Figure 10:
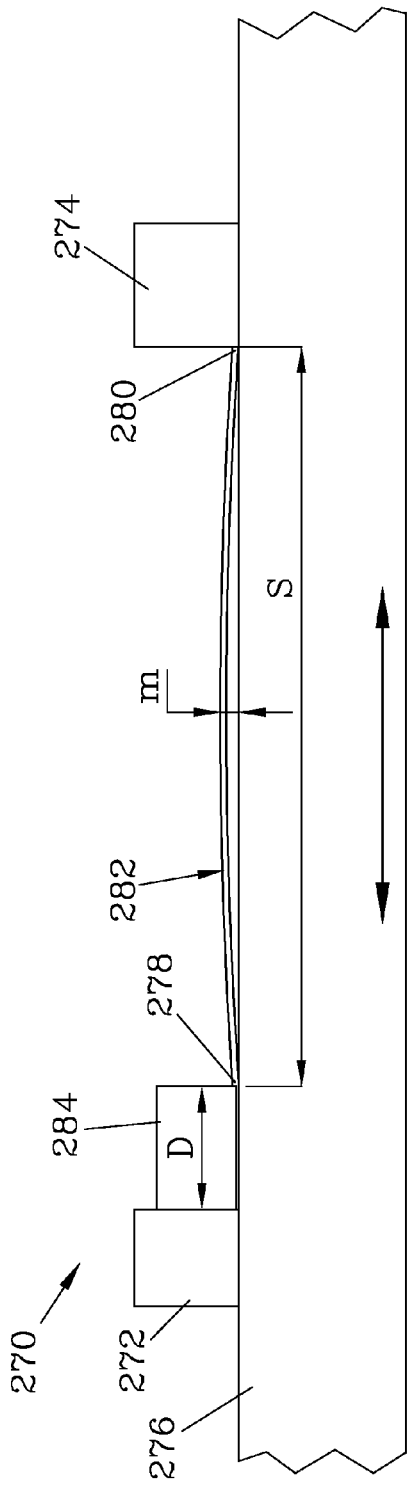
FIG. 10 is a schematic view showing another embodiment of the present invention, a mechanical amplifier which is designed for use as a micro-strain gauge. For such applications, the non-compliant stops are attached directly to the surface of the specimen for which the surface strain is to be measured. A spacer which is attached to one of the stops allows the spacing between the stops to be adjusted to set a predetermined bow in a resilient element.

FIG. 10 is a schematic view showing another embodiment of the present invention, a mechanical amplifier 270. This embodiment differs from the earlier described embodiment it that the embodiment is not intended to be responsive to environmental stimuli but rather to state of strain to a surface of a structure to which the mechanical amplifier 270 is attached. In the mechanical amplifier 270, a first non-compliant stop 272 and a second non-compliant stop 274 are both attached to a structure 276 so as to monitor dimensional changes in the structure 276. The non-compliant stops (272, 274) are positioned such that first and second ends (278, 280) of a resilient element 282 can be placed to reside therebetween. While it may be possible to cut and insert the resilient element 282 of the proper length to provide an appropriate bend for subsequent monitoring of the change in the strain of a the structure 262, such will, at best, require great patience and care.

This difficulty can be avoided by providing the first stop 272 with an adjustable length spacer 284 that is attached thereto and which is designed to abut the resilient element 282 when in service. This adjustable length spacer 284 reduces the criticality of the placement of the non-compliant stops (272, 274) relative to each other, and still allows maintaining a desired separation S between the stops (272, 274). To maintain the bowing of the resilient element 282 at a desired degree, the adjustable length spacer 284 is adjusted to a length D so as to set the separation S between the stops (272, 274) to provide an appropriate bowing displacement m. The resilient element 282 should be selected to have a constant length when in service, so that any changes in the bowing displacement m are due to dimensional changes in the structure 276 that cause the separation S to change and are not caused by dimensional changes of the resilient element 282 due to environmental stimuli.

Figure 11:
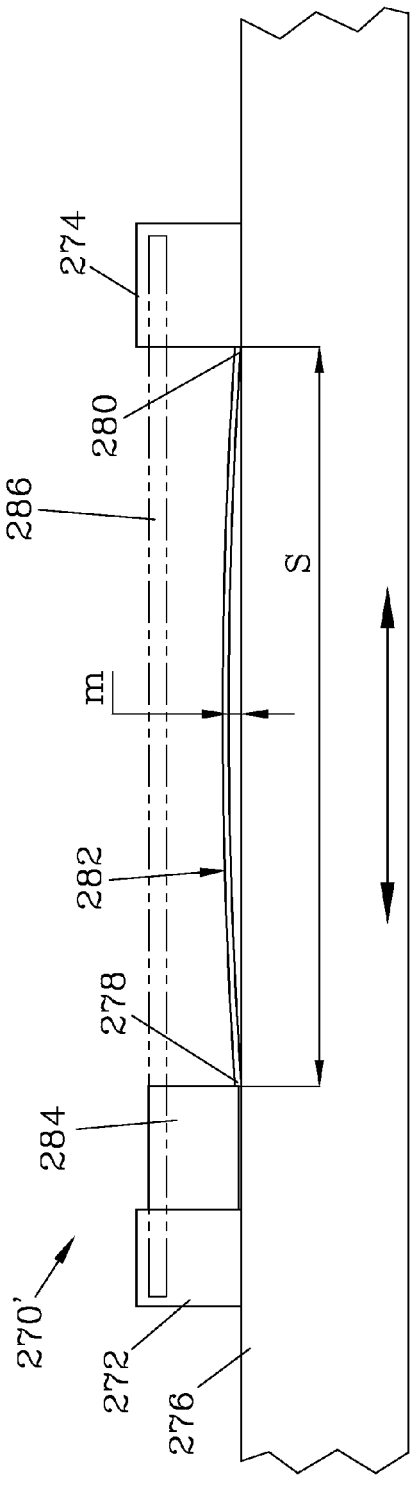
FIG. 11 is a schematic view showing another embodiment of the present invention suitable for use as a strain gauge, a mechanical amplifier which employs many of the elements of the mechanical amplifier shown in FIG. 10, but has a removable spacer attached to the stops that will assure that the stops are set apart at a predetermined distance so the stops can ve be installed as a unit. After attachment, the spacer is removed.

FIG. 11 is a schematic view showing an embodiment of the present invention similar to that shown in FIG. 10 and suitable for use as a strain gauge, but which simplifies installation of the mechanical amplifier 270' onto the structure 276. In the current embodiment, the mechanical amplifier 270' has the first stop 272 and the second stop 274 held in a fixed separation by at least one spacer bar 286 (shown in phantom) before application to the surface of the structure 276. After the stops (272, 274) are affixed to the structure 276, the spacer bar(s) 286 are removed, such as by laser ablation or chemical dissolving, leaving the stops (272, 274) free to change in separation as the dimension of the structure 276 changes and allowing the resilient element 282 to bow in response to changes in the dimensions of the structure 276. The use of the spacer bar(s) 286 allows the mechanical amplifier 270' to be attached to the structure 276 as a unit, easing installation of the mechanical amplifier 270'.

Figure 12:
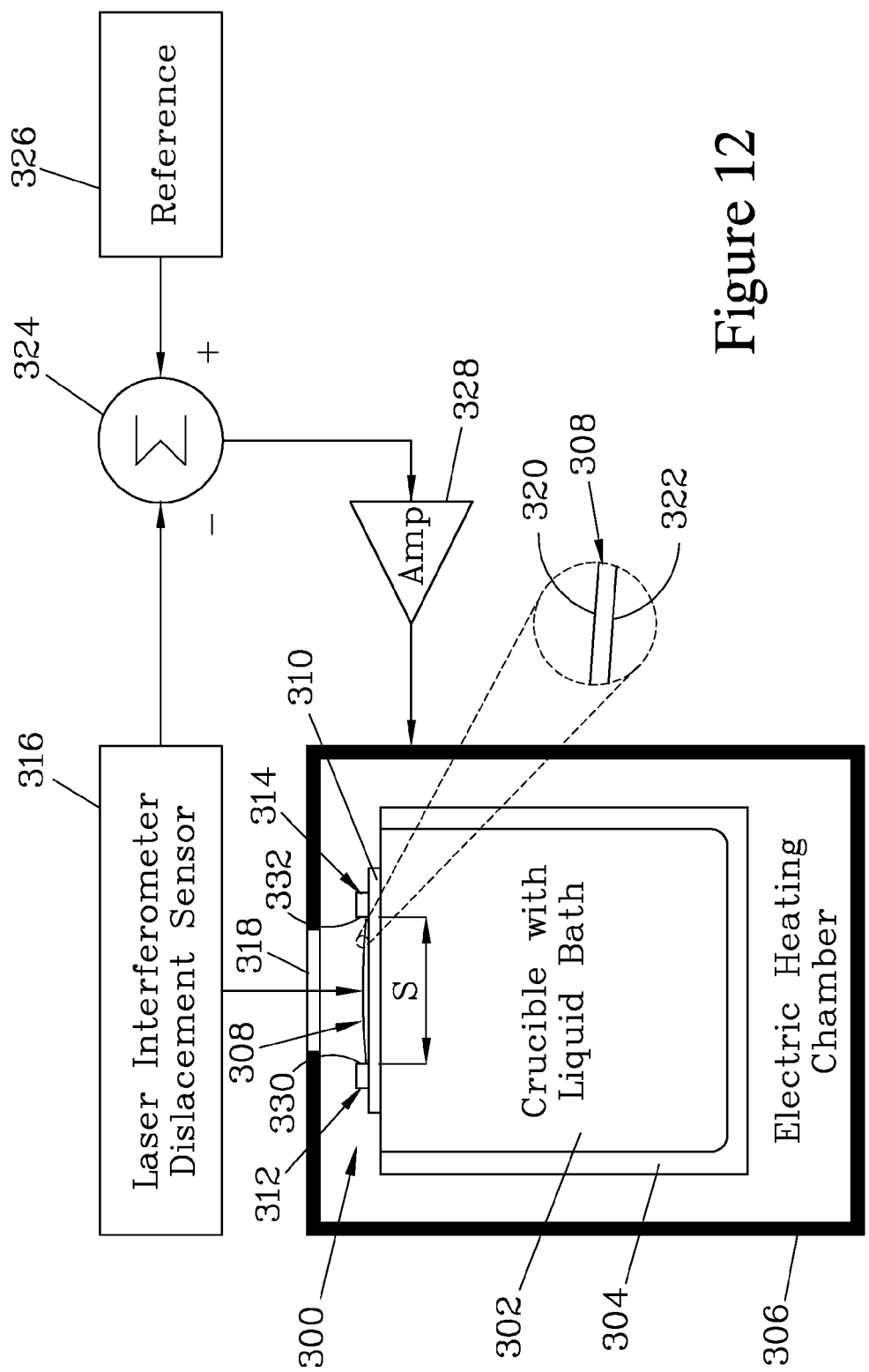
FIG. 12 is a schematic view of a temperature controller which employs one embodiment of the mechanical amplifier of the present invention as part of a system for controlling the temperature of a liquid bath which is to be maintained at a desired temperature.

FIG. 12 illustrates a mechanical amplifier 300 that is designed to be used to monitor the temperature of a liquid bath 302 and maintain the liquid bath 302 at a constant temperature, the liquid bath 302 residing in a crucible 304 which, in turn, is housed in an electric heating chamber 306. The mechanical amplifier 300 has a resilient element 308, a substrate 310, and non-compliant stops (312, 314). The mechanical amplifier 300 is mounted atop the crucible 304 and within the electric heating chamber 306. A laser interferometer 316 measures the bowing displacement of the resilient element 308 through a low-heat-loss window 318 in the chamber 306.

The resilient element 308 for this embodiment has a free length L (not shown) which is the total length of the resilient element 308, as is true of the resilient elements of the mechanical amplifiers (10, 100, 150) shown in FIGS. 1-3, 6, and 7. A reflective top surface 320 is provided on the resilient element 308, this top surface 320 facing the laser interferometer 316. The resilient element 308 also has a bottom surface 322 which faces the substrate 310.

The displacement measurement provided by the interferometer 316 is supplied to a subtracter 324 where it is compared to a reference 326. A power amplifier 328 supplies enough power to the electric heating chamber 306 to compensate for its heat loss to the cooler outside environment.

The substrate 310 for this embodiment should be fabricated from fused quartz or a similar material which has a relatively low thermal expansion, while the resilient element 308 should be fabricated from a high thermal expansion material such as stainless steel. The thermal expansion coefficient of the substrate 310 subtracts from that of the resilient element 308, reducing sensitivity. However, materials for the resilient element 308 and the substrate 310 can be selected such that the expansion of the substrate 310 is significantly less in comparison. For example, stainless steel expands 15.9 e−6 m/m/C and quartz expands 0.55 e−6 m/m/C, giving a differential expansion coefficient of about 15.3e−6 m/m/C for these materials.

The non-compliant stops (312, 314) can be bonded to the substrate 310 with a spacing slightly closer than desired separation S and then micro-machined to trim their inside edges (330, 332) to the desired separation S. If the stops (312, 314) are made of 310 stainless steel, they can be readily micro-machined to provide the desired separation S therebetween. Because of the relatively small size of the non-compliant stops (312, 314) and the fact that they are bonded to the substrate 310, any change in the separation of the inside edges (330, 332) resulting from temperature changes in the non-compliant stops (312, 314) should be negligible.

In operation, if the displacement measurement from the resilient element 308 to the interferometer 316 is too large with regard to the reference displacement, the bowing of the resilient element 308 is less than desired, and the output of the interferometer 316 is greater (larger) than the output from the reference 326. In this situation, the subtracter 324 provides an increased (positive) output to the power amplifier 328, which in turn increases the power to the electric heating chamber 306. The electric heating chamber 306 responds by driving its temperature higher, causing increased temperature and thus increased bowing of the resilient element 308, until the interferometer 316 output again approaches that of the reference 326.

Figure 13:
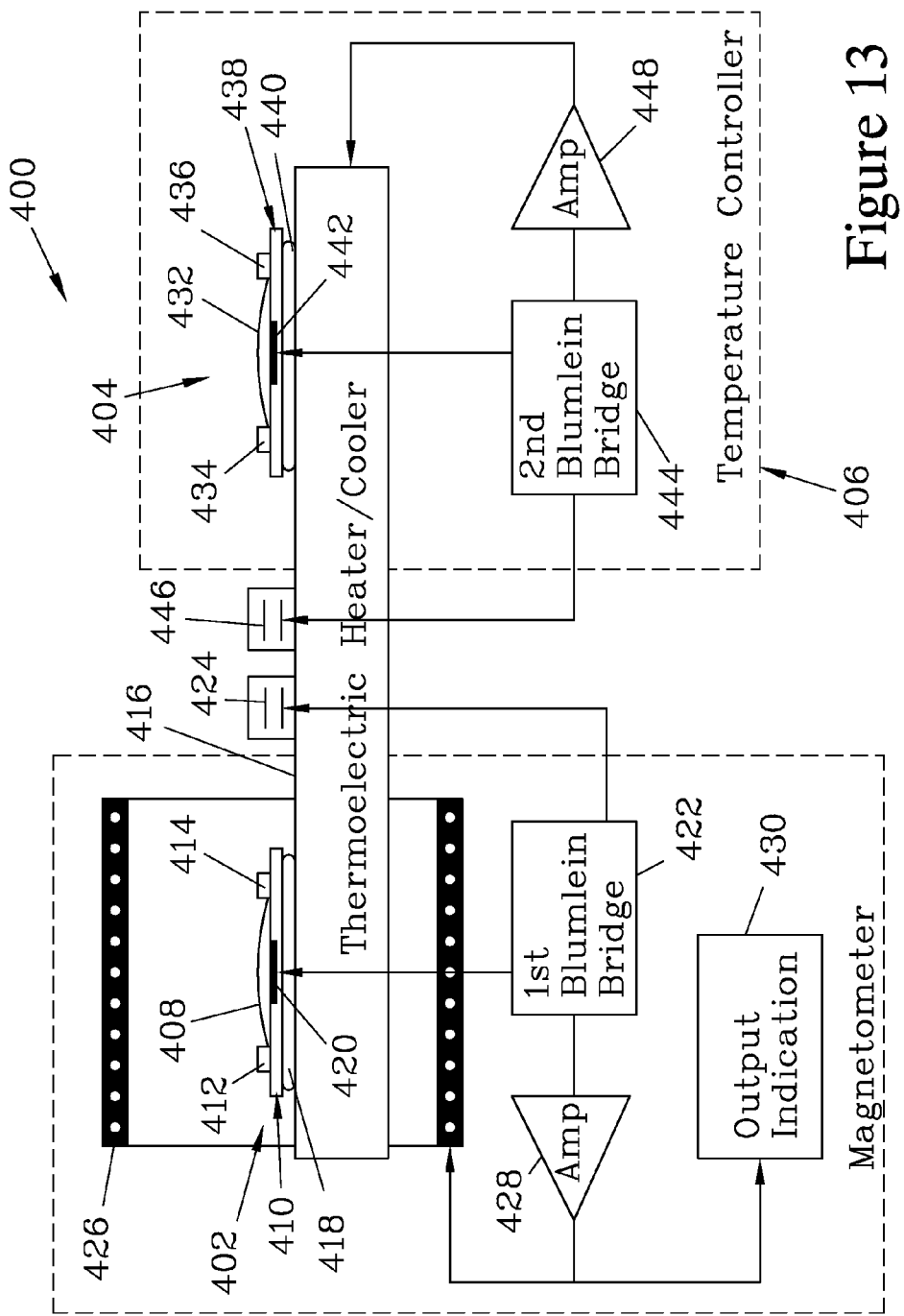
FIG. 13 is a schematic view that illustrates a magnetometer that employs a pair mechanical amplifiers having bowed resilient elements. One of the mechanical amplifiers monitors and regulates the temperature of a control support surface which supports both the mechanical amplifiers, while the other mechanical amplifier monitors the magnetic field as a function of time. This allows the operating temperature of the magnetometer to be closely controlled and maintained constant, thus enhancing the sensitivity of the magnetometer.

FIG. 13 illustrates a magnetometer 400 that employs a first mechanical amplifier 402 to monitor the magnetic field and a second mechanical amplifier 404, which is part of a precision temperature controller 406 that regulates the temperature of the first mechanical amplifier 402 so as to limit temperature fluctuations which would otherwise effect the response output by the first mechanical amplifier 402 as changes in the magnetic field occur.

One of the benefits from the use of the mechanical amplifier of the present invention is that it can readily provide a high gain (15,000, for example; see Table 1 above for the parameters which will provide such gain) before converting the expansion to electronic form, thereby greatly suppressing the inherent noise of electronic amplification. For this reason, the mechanical amplifier 402 creates an superior, ultra-sensitive magnetometer when it incorporates a magnetostrictive material for a resilient element or, alternatively, as a substrate. Having such sensitivity makes the magnetometer 400 well suited for a variety of applications such as studying geomagnetic anomalies, tracking ships, locating buried treasure, or mapping mineral deposits.

The first mechanical amplifier 402 has a resilient element 408, which is mounted above a substrate 410 and spans the distance between non-compliant stops (412, 414). The substrate 410 in turn mounts on a thermoelectric heater/cooler 416 which is used to maintain the first mechanical amplifier 402 at a constant temperature, thereby eliminating any bowing of the resilient element 408 due to thermal expansion. The substrate 410 in turn is attached to the thermoelectric heater/cooler 416 via a viscous layer 418 of a thermally conductive heat sink compound such as an alumina-filled silicone grease. In this way, the first substrate 410 can expand and contract independently from the thermoelectric heater/cooler 416 and still remain in intimate thermal contact therewith through the viscous layer 418. A conductor embedded in the substrate 410 creates a first electrode 420 that, in combination with the resilient element 408, forms a capacitor which serves as one arm of a first Blumlein bridge 422. The other arm of the first Blumlein bridge 422 is provided by a temperature-stable fixed capacitor 424, which is preferably mounted on the thermoelectric heater/cooler 416 for additional thermal stability. In this embodiment, the first Blumlein bridge 422 serves as the displacement sensor of the magnetometer 400. The fixed capacitor 424 is set to a value which is the same as the capacitance formed by the resilient element 408 and the first electrode 420 when the resilient element 408 is bowed to a desired degree.

A solenoid 426 is provided, which is a helically wound wire coil which serves as a single axis Helmholtz coil. The solenoid 426 is powered in such a manner as to null external magnetic field changes, keeping the net sensed magnetic field very nearly constant and thus avoiding nonlinearities due to magnetic saturation. To power the solenoid 426, an amplifier 428 increases the power level of the imbalance measurement of the first Blumlein bridge 422 to create a countering magnetic field in the solenoid 426. This in turn drives the first Blumlein bridge 422 toward balance. An output indication 430 responds to the magnitude of the electrical drive to the solenoid 426, and thus to the magnetic field needed to exactly counter the external magnetic field.

The right side of FIG. 13 illustrates details of the precision temperature controller 406. The second mechanical amplifier 404 is sensitive to temperature changes and has a second mechanical amplifier resilient element 432 which spans the distance between and is retained by a second pair of mechanical non-compliant stops (434, 436). The non-compliant stops (434, 436) are attached to a second mechanical amplifier substrate 438 which in turn is attached to the thermoelectric heater/cooler 416 via a viscous layer 440 of a thermally-conductive heat sink compound. A second embedded conductor provides a second electrode 442 which, in combination with the second mechanical amplifier resilient element 432, forms a capacitor which serves as one arm of a second Blumlein bridge 444. The other arm is provided by a temperature-stable fixed reference capacitor 446, which is preferably mounted on the thermoelectric heater/cooler 416 for thermal stability.

A second amplifier 448 adjusts the power level of the imbalance measurement of the second Blumlein bridge 444 to create a correcting temperature change in the thermoelectric heater/cooler 416, which in turn drives the second Blumlein bridge 444 toward balance in order to maintain a constant temperature so as to avoid any temperature changes that could mask the magnetic field changes being monitored by the first mechanical amplifier 402.

When the magnetometer 400 is in operation, the two mechanical amplifiers (402, 404) operate in a cooperative manner so as to avoid temperature variation as a function of time due to environmental temperature changes, by controlling the thermoelectric heater/cooler 416 with the second Blumlein bridge 444, while simultaneously allowing the first Blumlein bridge 422 to monitor the change in the magnetic flux. This is accomplished by having the second Blumlein bridge 444 monitor the capacitance between resilient element 432, which for this embodiment is a temperature sensitive non-magnetostrictive material, and the second electrode 442 to provide a corrective feedback system which holds the thermoelectric heater/cooler 416 at a constant temperature. The reference capacitor 446 in the second Blumlein bridge 444 determines the regulation temperature.

Thus, when the magnetometer 400 is in operation, the second Blumlein bridge 444 and associated elements adjust the thermoelectric heater/cooler 416 to a temperature which makes the capacitance formed by resilient element 432 and the second electrode 442 equal to that of the second Blumlein bridge reference capacitor 446. This also assures that the first mechanical amplifier 402 remains at the constant temperature set by the reference capacitor 446 of the second Blumlein bridge 444.

For the magnetometer 400 to function properly, the ambient field applied to the mechanical amplifier 402 must be sufficiently high that no measured counter magnetic field reduces it to zero. That is, there must always be a magnetic bias present, because the mechanical amplifier 402 responds to the magnitude of the magnetic field but cannot distinguish a north-going field from a south-going field. Three practical magnetic biases are the Earths's magnetic field, a bias current in a solenoid, and a permanent magnet. In the illustrated magnetometer 400, the bias is provided by the solenoid 426.

When biased by the Earth's magnetic field, neither the solenoid 426 nor the thermoelectric heater/cooler 416 needs power from the amplifiers (428, 448) under nominal conditions. However, the solenoid 426 needs to be powered if it supplies the magnetic bias. Alternatively, one could use a permanent magnet to provide the bias. When either the ambient temperature or the ambient magnetic field conditions change, the feedback system reacts to bring the sensors back to the nominal environment.

Again for the magnetometer 400, the first Blumlein bridge 422 and associated elements (the first amplifier 428, the solenoid 426, and the capacitance between the first resilient element 408 and first electrode 420) form a negative feedback system which holds the first resilient element 408 at a constant bowing.

For example, if the resilient element 408 is the magnetically sensitive element of the mechanical amplifier 402 and is made from a material which increases in length with an increase in magnetic field, the first resilient element 408 bows less if the ambient magnetic field being sensed decreases, creating greater capacitance with the first electrode 420. The first Blumlein bridge 422 goes out of balance, with the polarity of that imbalance being such as to cause the first amplifier 428 to power the solenoid 426 so as to produce a magnetic field in the solenoid 426 which adds to the ambient field. The negative feedback balances the first Blumlein bridge 422 by adding a magnetic flux exactly equal to the decrease in the ambient magnetic flux. The output indication 430 is set to read zero at the nominal bias magnetic field, and reports the difference between this design value and the present magnetic field based on the power needed by the solenoid 426 to maintain the degree of bowing of the resilient element 408 constant.

Figure 14:
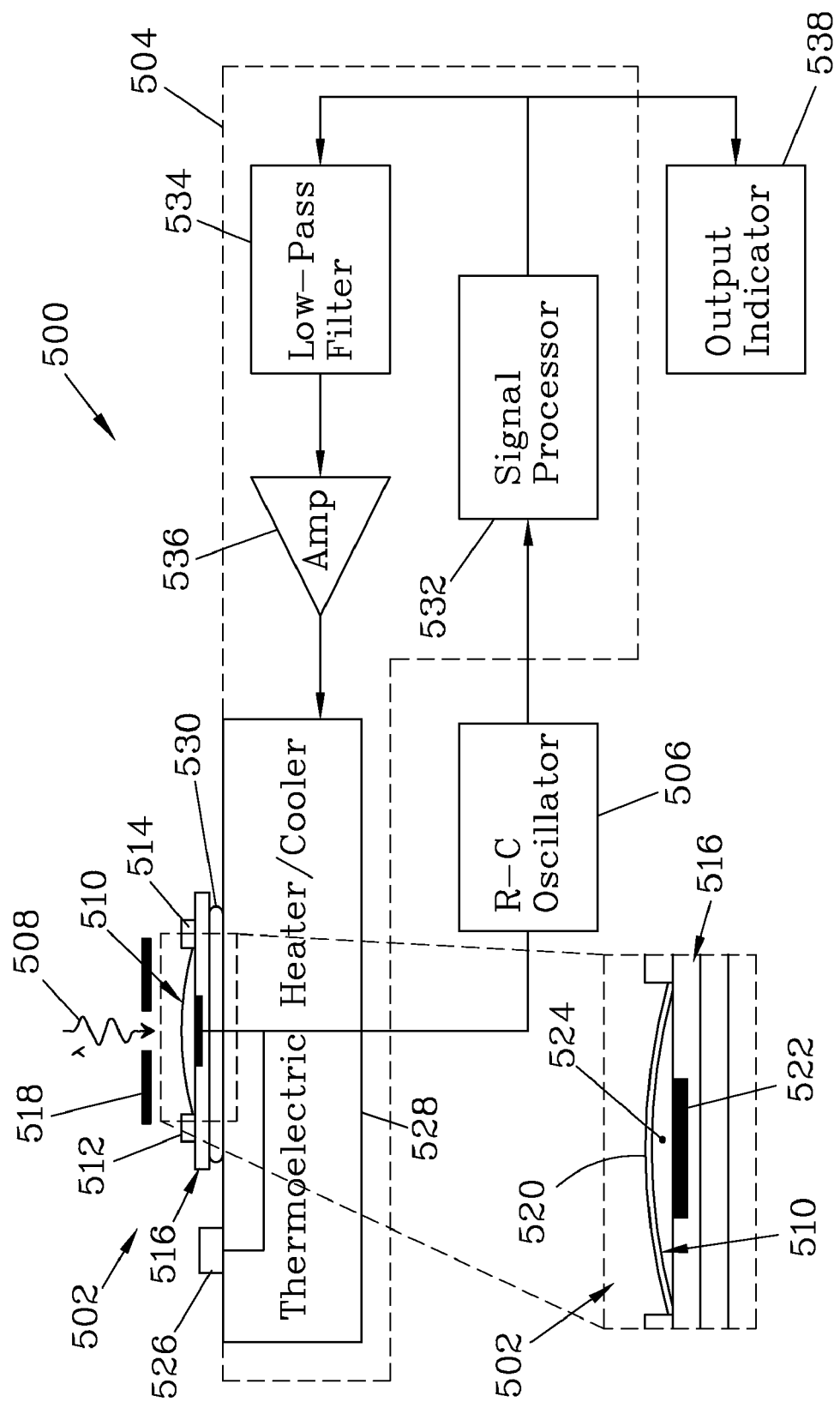
FIG. 14 illustrates a radiometer which employs a single mechanical amplifier which serves a dual function. The amplifier monitors the temperature of the radiometer and maintains it at a constant temperature as well and monitoring the incidence of exposure to the radiation in question. The duality of the service of this mechanical amplifier is made possible by distinct temporal response characteristics provided by the two phenomena being monitored.

FIG. 14 is a schematic view of a radiometer system 500 for which employs a mechanical amplifier 502 to noiselessly increase the thermal response to absorbed radiant energy prior to electronic amplification, thereby providing a highly sensitive radiation sensing instrument. Furthermore, the radiometer system 500 is designed to operate so as to be isolated from the variable temperature environment and correct for temperature changes in the environment by accurately controlling its own temperature. The radiometer system 500 is well suited for thermal detectors in the far and extreme infrared ranges having high sensitivity while operating at room temperature. The radiometer system 500 is not subject to humidity damage and can operate at any temperature likely to be experienced. The high sensitivity and rapid response of the radiometer system 500 make it ideal for Fourier Transform Infrared (FTIR) spectral or emissive signature analysis from reconnaissance aircraft or satellites.

The radiometer system 500 employs a feedback loop 504 to keep the average bowing displacement in the mechanical amplifier 502 constant as the temperature environment of the radiometer system 500 changes. The precisely controlled bowing in turn keeps the transduction gain (radiant watts to output volts) constant, to maintain high sensitivity. The temporal response time of the radiometer system 500 is not limited to an inherent property of a sensing material, as in the case of conventional bolometers normally used in the far infrared range.

The radiometer system 500 has an R-C oscillator 506 that serves as the displacement sensor, illustrating another way to sense the bowing change in the mechanical amplifier 502. The radiometer system 500 employs only the single mechanical amplifier 502 and uses it to simultaneously precisely control the temperature of the radiometer system 500 and to detect the radiant signal, which is caused by a source emitting radiation input 508 that varies in a relatively rapid manner.

In FIG. 14, the mechanical amplifier 502 has a resilient element 510, where a free length L is the full length of the resilient element 502. For this application, the resilient element 510 is typically a material such as stainless steel. The mechanical amplifier 502 also has non-compliant stops (512, 514), a substrate 516 (preferably fused quartz for this embodiment), and a displacement sensor which, for the embodiment shown, is the R-C oscillator 506. The radiation input 508 represents the radiant flux to be sensed, that flux arriving as substantially collimated energy from a distant source. An exposure stop 518 is employed to provide a controlled region of the resilient element 510 to be exposed to the radiation input 508. The resilient element 510 has an upper surface 520 which is treated to be highly absorptive of the radiation to which a response is sought, such as by a black nickel deposition thereon, which is a suitable surface treatment for stainless steel.

An electrode 522 is embedded in the surface of the substrate 516. In a preferred example, the electrode 522 is an aluminum contact polished flat, then oxidized to form a thin (e.g.: 5 nm) electrically insulating film. The combination of the electrode 522 and the resilient element 510 spaced apart therefrom by a gap 524 forms a capacitor.

The R-C oscillator 506 uses a low-noise, high stability conventional oscillator circuit. The capacitor formed by the resilient element 510 and the electrode 522 controls the frequency of the R-C oscillator 506, in conjunction with a fixed resistor 526.

The substrate 516 bonds to a thermoelectric heater/cooler 528 via a viscous layer 530 of a thermally conductive heat sink compound such as alumina-filled silicone grease, so that the substrate 516 can expand and contract independently from the surface of the thermoelectric heater/cooler 528. Preferably, the fixed resister 526 is also mounted on the thermoelectric heater/cooler 528 to maintain temperature stability of the fixed resistor 526.

A signal processor 532 operates on the signal generated by the R-C oscillator 506 to compare the measured signal to a reference, the reference corresponding to a desired degree of bowing of the resilient element 510. The signal processor 532 produces positive and negative voltages proportional to the difference of the measured signal from the reference. When the bowing capacitance is at a target nominal value, the signal processor 532 produces an output of zero volts.

The output of the signal processor 532 goes to a low-pass filter 534 that causes the feedback loop 504 to respond only to DC and very low frequencies (perhaps less than 0.2 Hz). The low frequency voltage changes that are passed through the low-pass filter 534 are then amplified by a power amplifier 536 to drive the thermoelectric heater/cooler 528.

The feedback loop 504 is provided by the capacitor formed by the resilient element 510 and the electrode 522 separated by the gap 524; the R-C oscillator 506 which responds to the capacitance; the signal processor 532; the low-pass filter 534; the power amplifier 536; the thermoelectric heater/cooler 528; the viscous layer 530; the substrate 516 (the temperature of which tracks that of the thermoelectric heater/cooler 528); and the stops (512, 514), which conduct thermal energy between the substrate 516 and the resilient element 510. The resilient element 510 expands or contracts in response to the conducted thermal energy generated by the thermoelectric heater/cooler 528, causing a change in the bowing displacement of the resilient element 510 and thereby adjusting the capacitance employed in the R-C oscillator 506. This capacitance change in turn changes the signal generated by the R-C oscillator 506, which is processed by the signal processor 532 to provide a voltage that in turn operates the thermoelectric heater/cooler 528 in such a manner as to maintain the degree of bowing in the resilient element 510 constant for very low frequency changes. Thus, the feedback loop 504 holds the long term output of the signal processor 532 very close to zero volts. However, any rapidly changing radiation 508 will cause relatively rapid expansion and contraction of the resilient element 510, and thus fast variations in the capacitor formed by the resilient element 510 and the electrode 522. These rapid changes show up at the output of the signal processor 532 and are blocked by the low-pass filter 534, and thus do not cause the thermoelectric heater/cooler 528 to compensate for such changes. These fast variations, the desired signal from the rapidly varying (say, faster than 1.0 Hz) radiant energy input 508, go to an output indicator 538.

Figure 15:
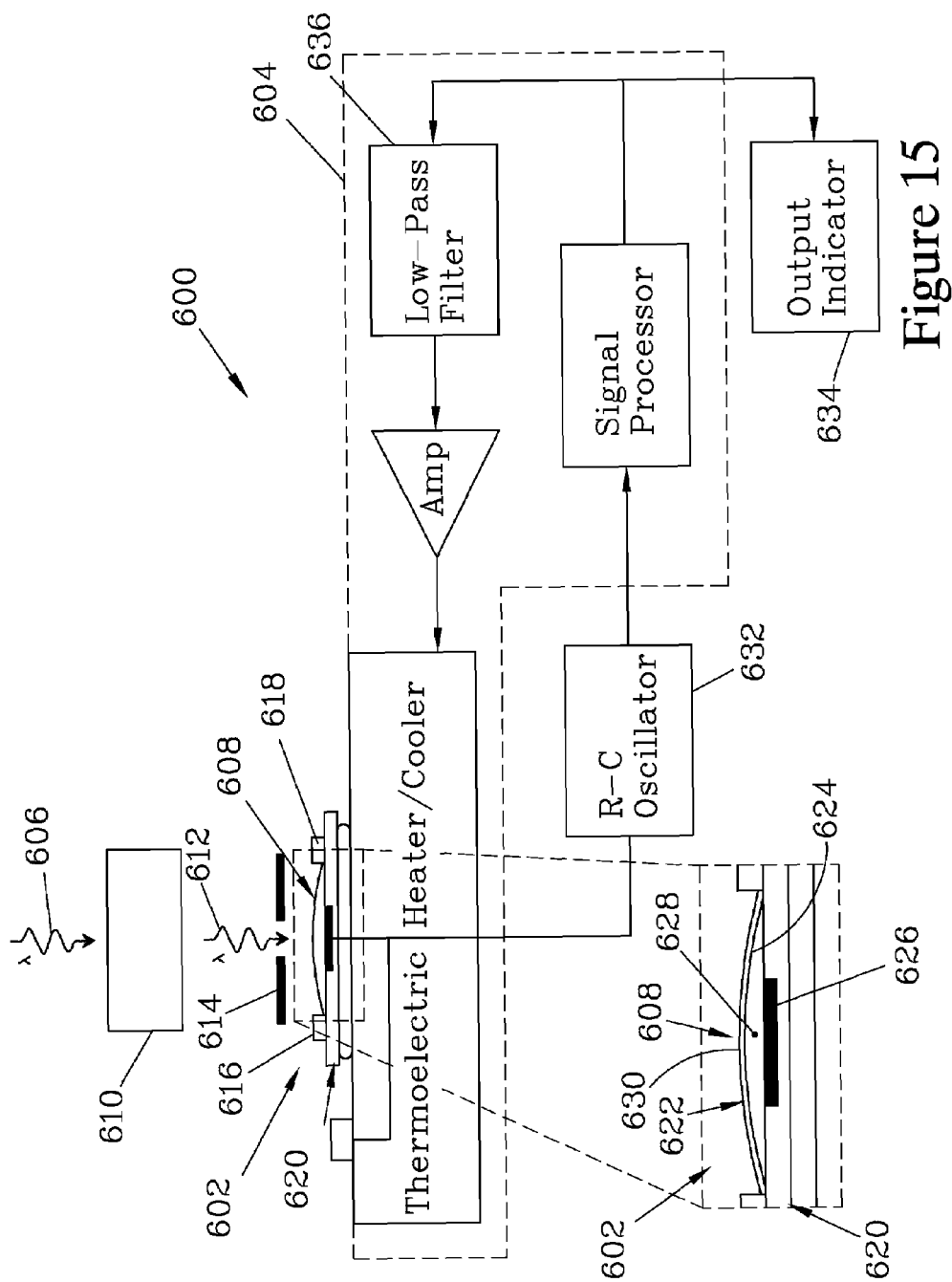
FIG. 15 illustrates a second embodiment for providing a radiometer which employs a single mechanical amplifier, which again monitors both temperature of the radiometer as well as the flux from a radiation source. This embodiment differs from the radiometer illustrated in FIG. 14 in that it is designed for use under conditions where background photon noise would mask the radiation sought to be monitored if a classic radiometer were used. Structurally, this embodiment differs, in part, in the character of the resilient element employed. This embodiment also includes an optical processing unit which conditions the radiation which passes into the radiometer.

FIG. 15 is a schematic view of a radiometer system 600 sharing many of the structural features of the radiometer system 500 illustrated in FIG. 14. The radiometer system 600 also corrects for the effects of temperature changes while employing a single mechanical amplifier 602, by use of a feedback loop 604. The radiometer system 600 is further designed so as to suppress thermal photonic noise from background radiation, including that from optics and baffles (not shown) in the detector's field of view. This noise arises from the random spatial and temporal variations in the steady average background thermal radiant flux and can mask target radiation 606 that is emitted by a source to be tracked in an environment where the background radiation has an integrated intensity that is greater than the target radiation 606 emitted from the source. Thus, the radiometer system 600 must differ from the radiometer system 500 in that it is designed to operate in an environment where there is substantial background radiation noise (photon shot noise) which, unless suppressed, will mask the target radiation 606 emitted from a time-varying radiant source residing in the environment. The suppression occurs because the mechanical amplifier 602 employed in the radiometer system 600 does not involve a photo-electron interaction for sensing radiation and does not respond to local heating, which has an area much smaller than the sensitive area of a resilient element 608. As discussed below, the radiometer system 600 responds only to the spatial average of the incident radiation.

The target radiation 606 from the source (not shown) is processed, along with background radiation, by an optical processing unit 610 which contains a collection of optics, optical filters, and field of view (spatial) filters/stops to provide a collimated (unfocused) radiant flux 612 which spreads the component of the radiation 606 from the target and background and which distributes the target radiation 606 over the receiving area of the resilient element 608.

Again, the mechanical amplifier 602 has an exposure stop 614 to limit the region of the resilient element 608 that is exposed to the collimated radiation 612. The resilient element 608 is sized to abut a pair of stops (616, 618) which are mounted on a substrate 620. If background radiation (photon shot noise, which is described more physically below) which is not associated with the target radiation 606 is to effect the radiometer system 600, it must be through a dimensional change in the resilient element 608.

The major difference in the radiometer system 600 over the radiometer system 500 resides in a change in the material of the resilient element 608 from one of high thermal diffusivity to one of low thermal diffusivity. The resilient element 510 shown in FIG. 14 is designed so as to be highly absorbent of the radiation which impacts it, thus promoting heating of the resilient element 510; however, in addition to being highly absorbent of the energy from the radiation impacting thereon, the resilient element 510 is also thermally very conductive (high diffusivity), and thus promotes the distribution the energy throughout the resilient element 510.

In contrast, in the radiometer system 600, the resilient element 608 is made from a composite structure having a principal layer 622 formed from a bi-axially oriented polyethylene terephthalate (known as bo-PET or Mylar®) and thus its response to the collimated radiation 612 will differ from the response of the resilient element 510 since this material has low thermal diffusivity. This low thermal diffusivity does not promote the radial distribution of the thermal energy throughout the resilient element 608 so as to provide a uniform temperature across the resilient element 608 needed to cause bowing in response to the thermal energy.

The principal layer 622 is or can be made to be highly absorbent of radiation in the desired wavelengths; however, the material of the principal layer 622 has a low thermal diffusivity, which is key to reducing the effect of thermal background noise in this embodiment, since this will effectively block the unwanted noise-induced bowing as discussed below.

Since the principal layer 622 of the resilient element 608 has a low electrical conductivity, an aluminum layer 624 is evaporated thereon and is deposited onto a lower surface of the bo-PET resilient element 608, which faces the substrate 620. The aluminum layer 624 makes the lower surface of the resilient element 608 electrically conductive for use as a capacitor element. The other conductive element of the capacitor is provided by an electrode 626 that is embedded in the substrate 620 and has an anodized surface for insulating the aluminum layer 624 when in contact with the surface of the electrode 626; the electrode 626 is separated from the aluminum layer 624 by an air gap 628. While the principal layer 622 is not highly electrically conductive, it must be highly absorptive of the incident radiation. This may be accomplished by providing a highly absorbent upper surface 630, or alternatively by dyeing or similarly coloring the material of the principal layer 622. The latter technique is particularly appealing in that, since the lower surface is bounded by the aluminum layer 624, any radiation that would pass through the lower surface will, in part, be reflected back into the principal layer 622 and thus increase its absorption.

The mechanical amplifier 602 is configured such that the localized heat generated in the principal layer 622 of the resilient element 608 from a photon of background radiation (because it is spatially and time wise dispersed and localized) can be extracted from the resilient element 608, passing through the air gap 628 into the substrate 620 much more rapidly than the heat can diffuse across the width of the resilient element 608. The resilient element 608 cannot begin to bow from thermal expansion until the heat spreads across its width, thus independent statistical variations in the localized radiation will not result in bowing.

The long thermal diffusion time constant (10 s) and the short gap conduction time constant (0.001 s) limit the heating effect of an isolated photon of background noise radiation to a small area. Before the heat can diffuse across the resilient element 608 to cause expansion, the thermal energy is conducted away to the substrate 620. A net expansion requires the simultaneous cooperation of an entire line of small areas across the resilient element 608.

At any given instant, approximately half of the small areas will be hotter than the average temperature of the resilient element 608, and half will be cooler. The probability that a transverse line of statistically independent areas will have a specific net expansion (or contraction) is the probability that one area has that expansion divided by the square root of the number of areas in the line. If the width of the resilient element 608 is appreciably greater than the diameter of the small heating area for an individual photon, the effect of individual variations (photonic noise) will be reduced accordingly.

For the optical processing and where the material parameters are appropriately selected as illustrated by the selection set forth in the sample calculation below, then for the resilient element 608 discussed above, photon heating affects an area about 200 nanometers in diameter for each photon, based on the lateral conduction progress before the heat is conducted to the substrate. If the width of the resilient element 608 is 2 mm, for example, and the photonic noise is assumed to be Gaussian, the thermal time constants suppress the photonic noise by the square root of 10,000, a factor of 100, for a single line of heating areas across the resilient element 608. The probability of N random events being between x and x+dx is proportional to the product of the probabilities of each being between x and x+dx. To get the proportionality constant, note that the probability of the event being between −infinity and +infinity is one. The probability function of the N events is the same as that of a single event, except that sigma (standard deviation) is then reduced by 1/square root of N.

However, in the event that there is a transverse line of small heated areas, there is an equal chance that the adjacent line of heating areas is experiencing the opposite expansion effect at that instant, which would cancel the effect of expansion. Treating each independent transverse line in the same statistical manner as the independent heating areas leads to a net photonic noise suppression of the square root of the number of heating area widths comprising the width of the resilient element, multiplied by the square root of the number of heating area widths comprising the exposed area in the direction of the length of the resilient element 608. For the example where the resilient element 608 has a 2 mm square detector area with 200 nm heating areas, the total suppression is 100× 100, or 10,000.

In contrast, an increase in the average target radiation 606 is distributed by the optical processing unit 610 across the entire detection area of the upper surface 630, needing no time to propagate laterally, and thus causes expansion across the width of the resilient element 608 without any delay due to slow diffusion time. This expansion results in immediate bowing of the resilient element 608 which causes a change in capacitance that can be readily detected by use of an R-C oscillator 632 and an output indicator 634, while slower changes due to ambient temperature variations are corrected by use of a low-pass filter 636.

If the radiation input 606 includes a strong local oscillator, such as might be provided by a maser, the radiometer system 600 can be employed as a heterodyne radio receiver operating at sub-millimeter wavelengths. Since the radiometer system 600 responds to power, which is the electric field vector of the radiation squared, the radiometer system 600 makes a perfect square-law mixer.

While the preferred embodiments discussed above all employ resilient elements that are rectangular in cross section and form relatively thin strips, other shapes can be employed. Examples of some configurations are illustrated in FIG. 16. To simplify fabrication of the mechanical amplifier of the present invention, it is preferred for the resilient element to have a cross-section such that there is a preferred bowing axis. This is clearly the case for a resilient element 710 having a rectangular cross section 712 as illustrated in FIG. 16. Here, a natural bowing axis 714 will be normal to shorter sides 716 of the resilient element 710. This rectangular shape is particularly well suited to ease fabrication, since the resilient element 710 having such a cross section can be laid on a substrate between two non-compliant stops when its free length L has been adjusted so it will fit therebetween by heating the substrate above the operating temperature or reducing temperature of the resilient element 710 so that it can be placed therebetween. Upon bringing the device to its operating conditions, the resilient element 710 will assume the bow such that it will have its bowing axis 714 parallel to the substrate. As noted earlier, care must be taken to select a thickness t that is sufficiently small relative to the free length L of the resilient element 710 so as to avoid plastic deformation of the resilient element 710 in service. Because the bowing will be about the bowing axis 714, the free length L may be made any convenient length.

A square cross section 720 will have many of the attributes of a rectangular cross section. However the square cross section 720 has two natural bowing axes (722, 724) which are respectively normal to a first pair sides 726 and a second pair of sides 728. Again, the square configuration 720 has the benefits of the rectangular cross section 712 when being assembled into a device.

An oval cross section 730 for a resilient element will benefit from having a single natural bowing axis 732 that will be normal to a minor axis 734 of the oval. The dimension of the minor axis 734 must be selected such that the thickness t will assure all deformation resulting from bowing will be elastic. A major axis 736 can have an arbitrary length, as is the case for the rectangular cross section 712. For the oval cross section 730, the installation of the resilient element so that the bowing axis 732 remains parallel to the substrate is more difficult, since there is no reference surface to be placed in contact with the substrate. The use of resilient pads and retainers such as employed in the embodiments shown in FIGS. 6 and 7 should reduce this problem and assist in maintaining the bowing axis 732 parallel to the substrate in service.

Even a round cross section 740 for the resilient element can be employed. However, when round resilient elements are employed, there is no preferred axis of bowing, but such a resilient element can be effectively used since, once an initial bow has been established, the bowing will continue to bow about the bowing axis. However, to assure that the bowing will be normal to the substrate, vertical slots can be provided in the non-compliant stops to guide the movement of the non-flat resilient element. FIG. 17 illustrates one example of a resilient element 742 (only partly shown) engaging a non-compliant stop 744 that is provided with a vertical slot 746 to guide the bowing of the resilient element 742. In the case of a resilient element formed by a nanowire, the bowing of such a resilient element could be stabilized by other means, such as an electric field, as known in the art.

The use of a resilient element that is not flat also makes the measurement of the displacement m more difficult, since it introduces curvature in the surface being monitored.

Sample Calculations

In order to provide a better appreciation of the benefits of the mechanical amplifier of the present invention in providing extremely high sensitivity measurements, sample computer calculations have been made with respect various embodiments shown in FIGS. 12-15 to better illustrate the likely performance base on the theoretical limits. The calculations use generally accepted models and equations, physical parameters from commercially available materials, fabrication tolerances available from existing commercial techniques, and readily available instrumentation.

For the temperature controller shown in FIG. 12, calculations were made for an operation temperature of 231° C. (the melting point of tin), with the resilient element 308 assumed to be made from 310 stainless steel having a length of 9.968482 mm at 25° C. and a thickness of 0.012 mm (assuring that, for the anticipated range of bowing, such deformation will be well within the elastic limit of the resileint element 308); for a separation S of 10.000000 mm between the stops (312, 314), the resilient element 308 would be bowed so as to create a displacement of 10.0 µm at 231° C. The substrate 310 is assumed to be made from fused quartz having a thermal expansion coefficient of 0.55e–6 m/m/° C., compared to a thermal expansion coefficient of 15.9e–6 m/m/° C. for the stainless steel resilient element 308.

From Table 1, any bowing displacement resulting from expansion in the length of the resilient element 308 should have a gain of 375×. A commercial laser interferometer 316 such as the Zygo Model 4004 can measure displacements to ±0.15 nm; for a gain of 375×, this minimum detectable displacement corresponds to an expansion of ±4.0e–13 m in length, which in turn corresponds to a change in temperature of ±2.6e–6° C.

For the magnetometer embodiment shown in FIG. 13, the first resilient element 408 is assumed to be made of 4-79 Permalloy (16.7% iron, 79% nickel, 4% molybdenum, 0.3% manganese) having a length 40.000000 mm long at 25° C. and having a thickness of 0.1 mm; this alloy expands with magnetomotive force at a rate of 0.3 um/m/Oersted, and has a relative permeability of 20,000. The separation between the stops (412, 414), the nominal operating temperature, and the bias provided by the solenoid 426 are assumed to be set such that the first resilient element 408 bows with a displacement of 1.0 µm. The first substrate 410 is assumed to be made of Corning 8363 high lead glass, having the same thermal expansion coefficient as the Permalloy. The first Blumlein bridge 422 can be designed to resolve capacitance balance, and hence the displacement of the resilient element 408, to 1 part in 5.0e9.

The second resilient element 432 is assumed to be from non-magnetic 310 stainless steel having a thermal expansion coefficient of 15.9e–6m/m/° C. and a length of 10.000000 mm at 25° C. and a thickness of 0.1 mm, mounted so as to create a displacement of about 1.0 µm at the nominal operating temperature. Calculations predict that the temperature controller 406 should detect and will reduce temperature differences changes to 3.4e–14° C.

The computer simulation predicts the performance of the magnetometer 400 having the parameters set forth above achieving a sensitivity of 550 femtotesla in a 1 Hertz bandwidth at an operating temperature of about 25 deg C.

For the radiometer system 500 shown in FIG. 14, resilient element 510 is assumed to be made of AISI 304 stainless steel with a length of 10.000000 mm at 25° C. and a thickness of 0.0125 mm, with the upper surface 520 treated so as to absorb more than 90% of radiation for wavelengths from 0.3e–6 m to 15e–6 m. The spacing of the stops (512, 514) and the nominal operating temperature are assumed to be set such that the resilient element 510 has a bowing displacement of 1.0 µm. The substrate 516 is assumed to be fused silica, having a TEC (thermal expansion coefficient) of 0.5e–6/° C. compared to a TEC of 14.7e–6/° C. for AISI 304 stainless steel.

In the simulation, the R-C oscillator 506 is set to operate at 1.28 KHz, the signal processor 532 provides a response time of about 400 microseconds, and the low-pass filter 534 has time constant of 10 s (0.016 Hz). For the parameters given, the simulation of thermal, mechanical, and electronic effects indicates a noise-equivalent-flux (NEF) of 200e–9 W/Hz$^{1/2}$/m$^2$. resulting in a D-Star rating of 5.0e+10 Jones.

Radiometer system 600 shown in FIG. 15 can be made more sensitive than that shown in FIG. 14 because it is not subject to thermal background noise known as Background Limited Input Power or BLIP. In the embodiment shown in FIG. 15, the resilient element 608 is made of a low thermal diffusivity material, biaxially oriented polyethylene terephthalate (bo-PET), with a length of 20.000000 mm at 25° C. and a thickness of 0.0125 mm, with the upper surface 630 treated so as to absorb more than 90% of radiation for wavelengths of interest. The spacing of the stops (616, 618) and the nominal operating temperature are assumed to be set such that the resilient element 608 has a bowing displacement of 1.0 µm. The substrate 620 is assumed to be fused silica, having a TEC (thermal expansion coefficient) of 0.5e–6/° C. compared to a TEC of 59.6e–6/° C. for bo-PET.

In the simulation, the R-C oscillator 632 is set to operate at 1.28 KHz, the signal processor in the feedback loop 604 provides a response time of 2.2 milliseconds, and the low-pass filter 636 has time constant of 10 s (0.016 Hz). For the parameters given, the simulation of thermal, mechanical, and electronic effects indicates a D-Star rating of 1.4e+12 Jones.

When the input radiation to the radiometer of FIG. 15 includes an 850 gigahertz local oscillator, it becomes a homodyne mixer suitable for radio astronomy. Operating as described at room temperature, its sensitivity is 4.3e–9 W/m$^2$, which equals that of a niobium titanium nitride (NbTiN) based superconductor-insulator-superconductor (SIS) receiver operating at 4 degrees Kelvin. The sensitive area the radiometer matches the diffraction-limited resolution of a 5-meter diameter f/4 radio telescope.

While the novel features of the present invention have been described in terms of particular embodiments and preferred applications, it should be appreciated by one skilled in the art that substitution of materials and modification of details obviously can be made without departing from the spirit of the invention.

What I claim is:

1. A method for monitoring the net dimensional changes in a free length L of a resilient element, the free length L of the resilient element extending along the resilient element between opposing end definition points, and a separation S between a pair of non-compliant stops, the method comprising the steps of:
    constraining the end definition points of the resilient element between the non-compliant stops that constrain the free length L of the resilient element at a separation S that is less than L so as to cause the resilient element to bow and create a displacement m of a central region of the resilient element with respect to a line intersecting the end definition points,
        wherein S is further limited such that S>2 m;
    restricting the flexure of the resilient element with respect to its thickness such that the resilient element does not exceed its elastic limit in use;
    monitoring the change in the displacement m of the central region of the resilient element with respect to the line intersecting the end definition points, this change resulting from bowing of the resilient element; and
    correlating the change in displacement m resulting from change in bowing to a net change in the free length L and the separation S.

2. The method of claim 1 wherein the free length L of the resilient element is held constant and further wherein the stops are mounted directly to a structure being monitored.

3. The method of claim 1 wherein the stops are mounted to a rigid substrate.

4. The method of claim 2 wherein the resilient element has a rectangular cross section providing a preferred direction for bowing, the rectangular cross section having its longer sides separated by a thickness t such that the preferred direction of bowing is normal to the longer sides and the thickness t being selected such that, when the resilient element is so bent in the preferred direction of bowing, all strain resulting from bowing of the resilient element remains elastic.

5. The method of claim 3 wherein the resilient element has a rectangular cross section providing a preferred direction for bowing, the rectangular section having its longer sides separated by a thickness t such that the preferred direction of bowing is normal to the longer sides and the thickness t being selected such that, when the resilient element is so bent in the preferred direction of bowing, all strain resulting from bowing of the resilient element remains elastic.

6. The method of claim 3 wherein the method is used to determine the change in an external stimulation resulting from an environmental variable, the resilient element and the substrate being constructed of materials which are selected so as to provide differing responses to the external stimulation, the method further comprising the step of:
    correlating the differential change in the separation S and the free length L to change in the external stimulation.

7. The method of claim 6 wherein the material of the substrate is chosen such that it has a negligible response to the external stimulation.

8. The method of claim 6 wherein said steps of monitoring the change in the displacement m and of correlating the differential change to change in the external stimulation, in combination, further comprise:
    providing a negative feedback stimulus so that, under normal operating conditions, the response of the resilient element and the substrate to the external stimulation is canceled;
    monitoring the amount of negative feedback stimulus needed to cancel the response; and
    correlating the amount of negative feedback to change in the external stimulation.

9. The method of claim 6 wherein the resilient element has a response to two environmental variables which occur concurrently, one resulting in a slow response and the other a rapid response, and further wherein the monitoring is done in a time-dependent manner to allow the responses to be separated.

10. A mechanical amplifier comprising:
    a resilient element having contained therein a free length L which resides between opposing end definition points on said resilient element;
    a pair of non-compliant stops constraining said opposing end definition points;
    means for maintaining a separation S between said pair of non-compliant stops such that S<L, thereby providing a bow in said resilient element that results in a displacement m of a central region of said resilient element with respect to a line intersecting said opposing end definition points;
    means for setting said bow so as to assure that a gain that is greater than 1 is obtained from changes in the displacement m of said central region of said resilient element with respect to the line intersecting said opposing end definition points, such changes occurring in response to a net dimensional change in at least one of the free length L of said resilient element and the separation S;
    means for monitoring the change in the displacement m of said central region of said resilient element with respect to the line intersecting said opposing end definition points, resulting from the net dimensional change resulting from changes in at least one of the separation S and the free length L; and
    means for correlating changes in the displacement m to the net dimensional change.

11. The mechanical amplifier of claim 10 wherein said resilient element is chosen to be non-responsive to any environmental changes and said means for maintaining the separation S further comprises:
    means for attaching said pair of non-compliant stops to a surface of a structure which is to be monitored,
        thereby providing a micro-strain gauge.

12. The mechanical amplifier of claim 11 wherein one of said opposing end definition points is a terminal end of said resilient element and one of said pair of non-compliant stops constrains said one of said opposing end definition points by abutting thereto, and further wherein said one of said pair of stops that abuts said terminal end has an adjustable spacer which extends said one of said stops and provides for adjusting the separation S.

13. The mechanical amplifier of claim 10 wherein said means for maintaining the separation S between said pair of non-compliant stops such that S<L further comprises:
   a rigid substrate to which said non-compliant stops attach and
   further wherein the net dimensional change in at least one of the free length L of said resilient element and the separation S results from an external stimulation so that the mechanical amplifier serves as a sensing device wherein said substrate and said resilient element provide differential responses to the external stimulation so as to induce a change in the bow of said resilient element in response to changes in the external stimulation, thereby providing a sensing device for the external stimulation, the sensing device further comprising:
   means for correlating the net change in length to a change in the external stimulation.

14. The mechanical amplifier of claim 12 wherein said resilient element has a rectangular cross section providing a preferred direction for bowing, said rectangular section having its longer sides separated by a thickness t such that the preferred direction of bowing is normal to the longer sides and said thickness t being selected such that, when said resilient element is bent in the preferred direction of bowing, all strain resulting from bowing of said resilient element remains elastic.

15. The mechanical amplifier of claim 13 wherein said resilient element has a rectangular cross section providing a preferred direction for bowing, said rectangular section having its longer sides separated by a thickness t such that the preferred direction of bowing is normal to the longer sides and said thickness t being selected such that, when said resilient element is bent in the preferred direction of bowing, all strain resulting from bowing of said resilient element remains elastic.

16. The mechanical amplifier of claim 15 wherein said resilient element has a resilient element extension continuing said resilient element beyond one of said opposing end definition points, further wherein an associated one of said pair of non-compliant stops attaches to said substrate with said extension of said resilient element interposed therebetween so as to become secured to said substrate when said associated one of said pair of non-compliant stops is attached to said substrate, still further wherein said resilient element has a thickness t selected relative to the free length L such that the clamping of said resilient element extension does not significantly alter the bowing due to the net dimensional changes in at least one of the separation S and the free length L.

17. The mechanical amplifier of claim 16 wherein the one of said opposing end definition points not associated with said resilient element extension is a terminal end of said resilient element and the associated one of said pair of non-compliant stops abuts said terminal end, and further wherein said one of said pair of stops that abuts said terminal end terminates in an adjustable spacer that provides for adjusting the separation S.

18. The mechanical amplifier of claim 13 wherein said means for monitoring the change in the displacement m and said means for correlating the net change in length to a change in the external stimulation, in combination, further comprise:
   feedback means for biasing the bowing of said resilient element in service to its initial setting, thereby suppressing the net change in length resulting from the change which would naturally occur due to the external stimulation;
   means for monitoring the degree of biasing required to maintain the bowing of said resilient element in its initial setting; and
   means for correlating the degree of bias required to a change in the external stimulation.

19. The mechanical amplifier of claim 13 wherein the net change in length is responsive to both a slowly varying environmental stimulation and a rapidly varying environmental stimulation which occur concurrently, and further wherein said means for monitoring the degree of bias required includes a low-pass filter that allows the responses to be separated.

20. The mechanical amplifier of claim 13 wherein one of said opposing end definition points of said resilient element is a terminal end of said resilient element and the associated one of said pair of non-compliant stops abuts said terminal end, and further wherein said one of said pair of stops that abuts said terminal end terminates in an adjustable spacer that provides for adjusting the separation S.

* * * * *